(12) United States Patent
Kawada et al.

(10) Patent No.: US 11,450,784 B2
(45) Date of Patent: Sep. 20, 2022

(54) LIGHT-EMITTING THYRISTOR, LIGHT-EMITTING ELEMENT CHIP, OPTICAL PRINT HEAD, AND IMAGE FORMING DEVICE

(71) Applicant: Oki Data Corporation, Tokyo (JP)

(72) Inventors: Hiroto Kawada, Tokyo (JP); Kenichi Tanigawa, Tokyo (JP); Shinya Jyumonji, Tokyo (JP); Takuma Ishikawa, Tokyo (JP); Chihiro Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 173 days.

(21) Appl. No.: 16/905,330

(22) Filed: Jun. 18, 2020

(65) Prior Publication Data
US 2020/0411715 A1    Dec. 31, 2020

(30) Foreign Application Priority Data

Jun. 27, 2019 (JP) .............................. JP2019-119529

(51) Int. Cl.
*H01L 33/00* (2010.01)
*H01L 33/02* (2010.01)
*H01L 33/30* (2010.01)
*H01L 27/15* (2006.01)
*G03G 15/04* (2006.01)

(52) U.S. Cl.
CPC ... *H01L 33/0016* (2013.01); *G03G 15/04054* (2013.01); *H01L 27/153* (2013.01); *H01L 33/0025* (2013.01); *H01L 33/0062* (2013.01); *H01L 33/025* (2013.01); *H01L 33/305* (2013.01); *G03G 2215/0409* (2013.01)

(58) Field of Classification Search
CPC .......................... H01L 33/0016; H01L 33/025
See application file for complete search history.

(56) References Cited

U.S. PATENT DOCUMENTS

2017/0219952 A1* 8/2017 Furuta .............. G03G 15/04036
2019/0070864 A1* 3/2019 Uchida .................. G03G 15/04

FOREIGN PATENT DOCUMENTS

JP           2010239084 A    10/2010

* cited by examiner

*Primary Examiner* — Moazzam Hossain
*Assistant Examiner* — Hajar Kolahdouzan
(74) *Attorney, Agent, or Firm* — Rabin & Berdo, P.C.

(57) ABSTRACT

A light-emitting thyristor includes a first semiconductor layer of a P type, a second semiconductor layer of an N type arranged adjacent to the first semiconductor layer; a third semiconductor layer of the P type arranged adjacent to the second semiconductor layer; and a fourth semiconductor layer of the N type arranged adjacent to the third semiconductor layer. A part of the first semiconductor layer is an active layer adjacent to the second semiconductor layer. A dopant concentration of the active layer is higher than or equal to a dopant concentration of the third semiconductor layer. A thickness of the third semiconductor layer is thinner than a thickness of the second semiconductor layer. A dopant concentration of the second semiconductor layer is lower than the dopant concentration of the third semiconductor layer.

17 Claims, 18 Drawing Sheets

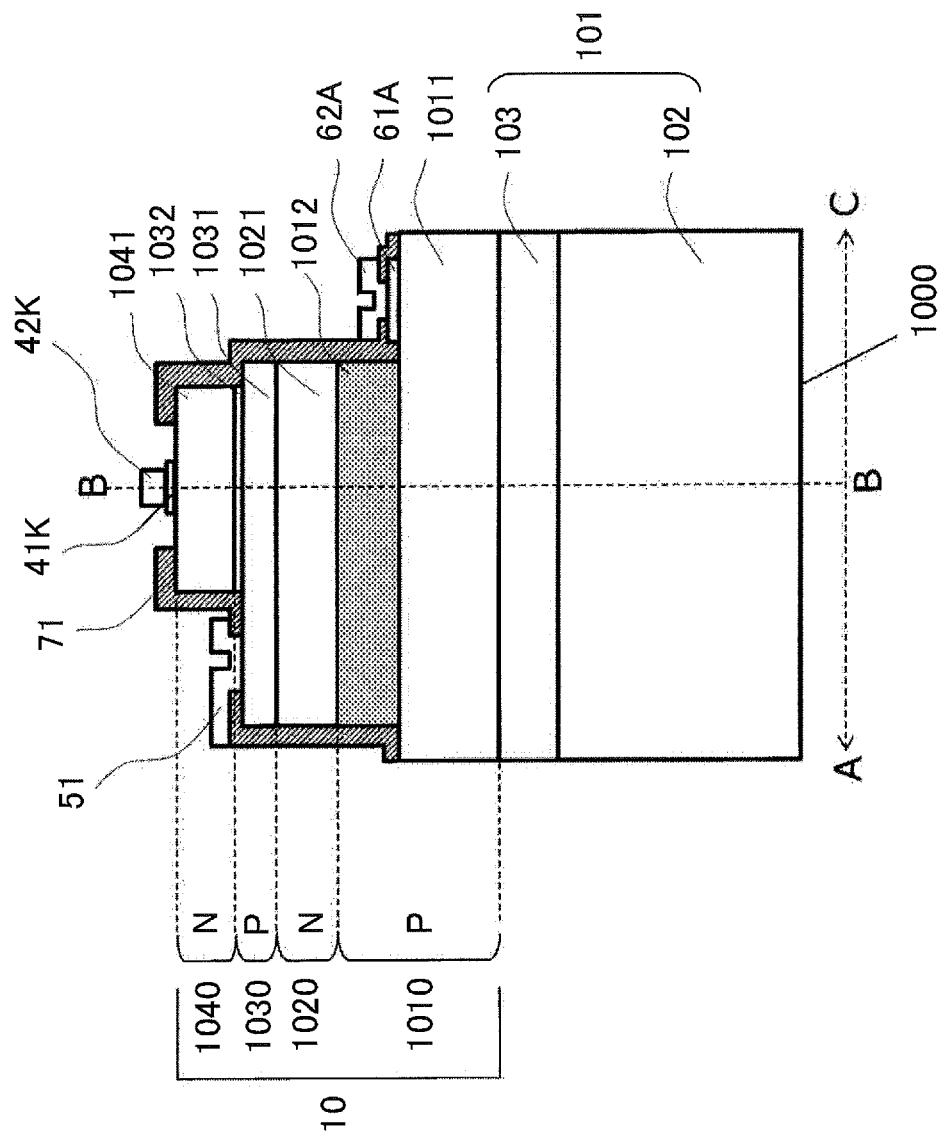

# US 11,450,784 B2

LIGHT-EMITTING THYRISTOR, LIGHT-EMITTING ELEMENT CHIP, OPTICAL PRINT HEAD, AND IMAGE FORMING DEVICE

BACKGROUND OF THE INVENTION

1. Field of the Invention

The present invention relates to a light-emitting thyristor, a light-emitting element chip including the light-emitting thyristor, an optical print head including the light-emitting element chip, and an image forming device including the optical print head.

2. Description of the Related Art

Conventionally, image forming devices of the electrophotographic type, equipped with an optical print head including a plurality of light-emitting elements as an exposure device, have been widespread. In such an image forming device, an electrostatic latent image is formed on the surface of a photosensitive drum by applying light emitted from the optical print head to the surface of the photosensitive drum. As the light-emitting elements included in the optical print head, light-emitting thyristors as three-terminal light-emitting elements have been well known (see Japanese Patent Application Publication No. 2010-239084, for example).

However, a more excellent light emission property is being required in the conventional light-emitting thyristors.

SUMMARY OF THE INVENTION

The object of the present invention is to provide a light-emitting thyristor having an excellent light emission property, a light-emitting element chip including the light-emitting thyristor, an optical print head including the light-emitting element chip, and an image forming device including the optical print head.

A light-emitting thyristor according to an aspect of the present invention includes: a first semiconductor layer of a first conductivity type; a second semiconductor layer of a second conductivity type, the second semiconductor layer being arranged adjacent to the first semiconductor layer; a third semiconductor layer of the first conductivity type, the third semiconductor layer being arranged adjacent to the second semiconductor layer; and a fourth semiconductor layer of the second conductivity type, the fourth semiconductor layer being arranged adjacent to the third semiconductor layer. A part of the first semiconductor layer is an active layer adjacent to the second semiconductor layer. A dopant concentration of the active layer is higher than or equal to a dopant concentration of the third semiconductor layer. A thickness of the third semiconductor layer is thinner than a thickness of the second semiconductor layer. A dopant concentration of the second semiconductor layer is lower than the dopant concentration of the third semiconductor layer.

According to the present invention, a light-emitting thyristor and a light-emitting element chip which have an excellent light emission property can be provided. Further, according to the present invention, an optical print head and an image forming device which can improve the quality of a print image can be provided.

BRIEF DESCRIPTION OF THE DRAWINGS

In the attached drawings,

FIG. 2 is a schematic cross-sectional view showing the structure of the light-emitting thyristor according to the first embodiment, namely, the cross-sectional structure at the line A-B-C in FIG. 1;

DETAILED DESCRIPTION OF THE INVENTION

Figure 1:
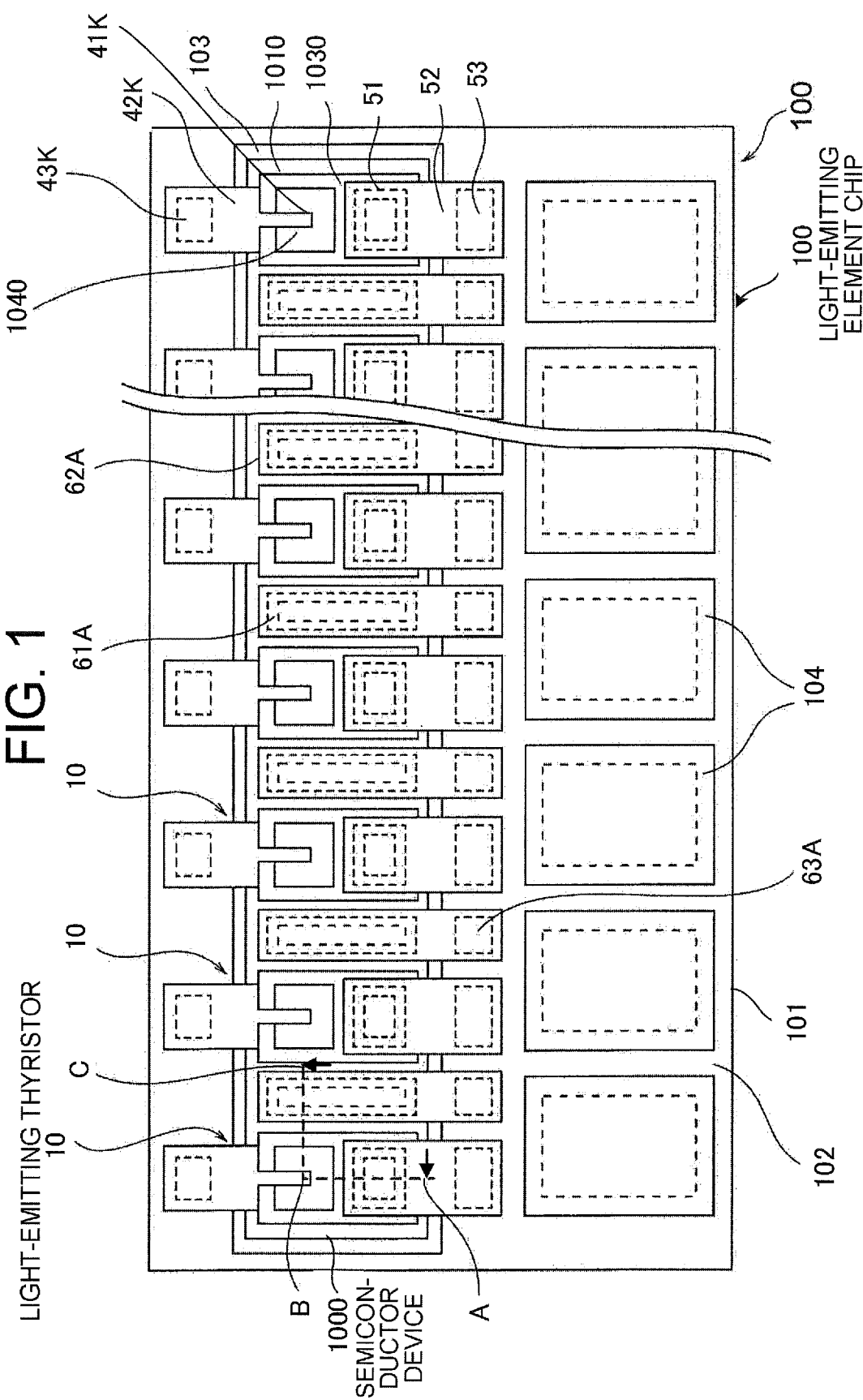
FIG. 1 is a schematic plan view showing the structure of a light-emitting thyristor according to a first embodiment of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Light-emitting thyristors, light-emitting element chips, optical print heads and image forming devices according to embodiments of the present invention will be described below with reference to drawings. In the drawings, the same components are assigned the same reference characters. The following embodiments are just examples for the purpose of illustration and a variety of modifications are possible within the scope of the present invention. For example, configurations of embodiments can be properly combined with each other.

In first to third embodiments, the light-emitting thyristors and the light-emitting element chips will be described. The light-emitting element chip includes one or more light-emitting thyristors. The light-emitting element chip may include a plurality of light-emitting thyristors arranged in a line. For example, the light-emitting element chip includes a substrate part and a plurality of light-emitting thyristors arranged on the substrate part. The light-emitting element chip may include a semiconductor integrated circuit part (referred to also as a "drive IC part") as a drive circuit for lighting up and extinguishing the plurality of light-emitting thyristors. The light-emitting element chip including the light-emitting thyristor and the drive IC part is referred to also as a "semiconductor composite device".

In a fourth embodiment, an optical print head including the light-emitting element chip in any one of the first to third embodiments will be described. The optical print head includes one or more light-emitting element chips. The optical print head is an exposure device for forming an electrostatic latent image on the surface of a photosensitive drum used as an image carrier of an image forming device. The optical print head may include a plurality of light-emitting element chips arranged in a line.

In a fifth embodiment, an image forming device including the optical print head according to the fourth embodiment will be described. The image forming device is a device that forms an image made of a developing agent on a print medium by means of an electrophotographic process. The image forming device is a printer, a copy machine, a facsimile machine, a multi-function peripheral (MFP) or the like, for example.

(1) First Embodiment

(1-1) Configuration

FIG. 1 is a schematic plan view showing the structure of a light-emitting thyristor 10 according to the first embodiment. FIG. 1 shows a semiconductor device 1000 including a plurality of light-emitting thyristors 10. The semiconductor device 1000 is arranged on a substrate part 101. As shown in FIG. 1, the substrate part 101 includes a substrate 102 and a planarization layer 103 formed on the substrate 102, for example. A light-emitting element chip 100 includes the substrate part 101 and the semiconductor device 1000 formed on the substrate part 101. The semiconductor device 1000 is referred to also as a "light-emitting element array" or a "light-emitting thyristor array".

Further, the light-emitting element chip 100 is referred to also as a "light-emitting element array chip" or a "light-emitting thyristor array chip". Incidentally, an insulation film 71 (shown in FIG. 2) is not shown in FIG. 1 for easy understanding of the structure of the semiconductor device 1000.

For example, a Si (silicon) substrate, an IC (integrated circuit) substrate, a glass substrate, a ceramic substrate, a plastic substrate, a metal plate or the like is usable as the substrate 102. In the first embodiment, the substrate 102 is an IC substrate including a drive IC part for driving the light-emitting thyristor as the three-terminal light-emitting element and an external connection pad 104 used for wiring to an external device.

The planarization layer 103 has a smooth surface on which the light-emitting thyristors 10 are arranged. The planarization layer 103 is an inorganic film or an organic film. In a case where a top surface of the substrate 102 is smooth, it is also possible to provide the semiconductor device 1000 on the top surface of the substrate 102 without providing the planarization layer 103.

The light-emitting thyristor 10 is formed on a growth substrate (referred to also as a "base material") used as a manufacturing substrate, for example. In a case where the light-emitting thyristor 10 is formed of an AlGaAs (aluminum gallium arsenide)-based semiconductor material, a GaAs (gallium arsenide) substrate can be used as the growth substrate. The light-emitting thyristor 10 is formed on the growth substrate by means of epitaxial growth, for example. The light-emitting thyristor 10 is formed by, for example, peeling off an epitaxial film, as a semiconductor thin film having a laminated structure of semiconductor layers, from the growth substrate, sticking the peeled epitaxial film on the surface of the planarization layer 103 on the substrate 102, and processing the epitaxial film by publicly known photolithography process and etching process. The epitaxial film placed on the surface of the planarization layer 103 is fixed to the planarization layer 103 by intermolecular force or the like.

FIG. 2 is a schematic cross-sectional view showing the structure of the light-emitting thyristor 10 according to the first embodiment, namely, the cross-sectional structure at the line A-B-C in FIG. 1. As shown in FIG. 2, the light-emitting thyristor 10 includes a first semiconductor layer 1010 of a first conductivity type, a second semiconductor layer 1020 of a second conductivity type different from the first conductivity type arranged adjacent to the first semiconductor layer 1010, a third semiconductor layer 1030 of the first conductivity type arranged adjacent to the second semiconductor layer 1020, and a fourth semiconductor layer 1040 of the second conductivity type arranged adjacent to the third semiconductor layer 1030. In the first embodiment, the first conductivity type is the P type and the second conductivity type is the N type.

Further, as shown in FIG. 2, the light-emitting thyristor 10 includes an anode electrode 61A as a first electrode electrically connected with the first semiconductor layer 1010, a gate electrode 51 as a second electrode electrically connected with the third semiconductor layer 1030, and a cathode electrode 41K as a third electrode electrically connected with the fourth semiconductor layer 1040. The anode electrode 61A is electrically connected with an anode terminal of the substrate part 101 by anode wiring 62A. The gate electrode 51 is electrically connected with a gate terminal 53 (shown in FIG. 1) of the substrate part 101 by gate wiring 52 (shown in FIG. 1). The cathode electrode 41K is electrically connected with a cathode terminal 43K (shown in FIG. 1) of the substrate part 101 by cathode wiring 42K.

The P-type first semiconductor layer 1010 includes an anode layer 1011 electrically connected with the anode electrode 61A and a P-type active layer 1012 arranged adjacent to the anode layer 1011. Thus, a part of the first semiconductor layer 1010 is the active layer 1012 adjacent to the second semiconductor layer 1020. The N-type second semiconductor layer 1020 includes an N-type gate layer 1021. The P-type third semiconductor layer 1030 includes a P-type gate layer 1031 and an etching stop layer 1032. The N-type fourth semiconductor layer 1040 includes an N-type cathode layer 1041.

Semiconductor materials forming the first to fourth semiconductor layers 1010, 1020, 1030 and 1040 are, for example, InP (indium-phosphorous)-based semiconductor materials, AlGaAs-based semiconductor materials, AlInGaP (aluminum-indium-gallium-phosphorous)-based semiconductor materials, or the like.

In a case where AlGaAs-based semiconductor materials are used for the first to fourth semiconductor layers 1010, 1020, 1030 and 1040, the anode layer 1011 is, for example, a P-type $Al_{0.25}Ga_{0.75}As$ layer, the active layer 1012 is, for example, a P-type $Al_{0.15}Ga_{0.85}As$ layer, the N-type gate layer 1021 is, for example, an N-type $Al_{0.15}Ga_{0.85}As$ layer, the P-type gate layer 1031 is, for example, a P-type $Al_{0.15}Ga_{0.85}As$ layer, and the cathode layer 1041 is, for example, an N-type $Al_{0.25}Ga_{0.75}As$ layer. The etching stop layer 1032 is, for example, a P-type $In_{0.49}Ga_{0.51}P$ layer.

Figure 3A:
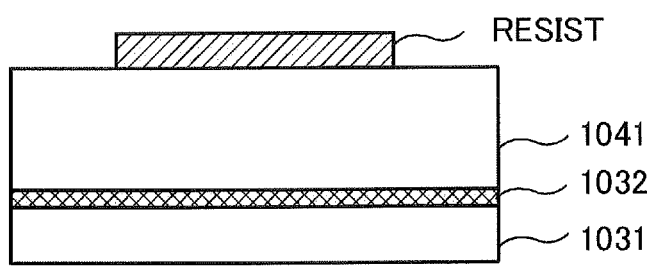
FIGS. 3A to 3C are cross-sectional views showing a fabrication process using an etching stop layer.
Figure 3B:
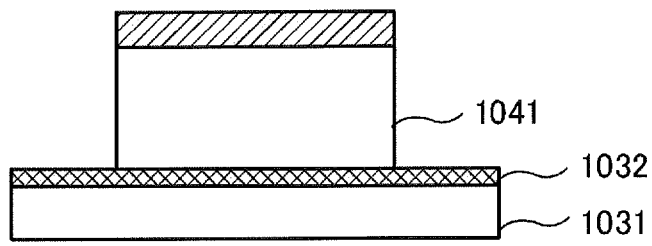
Figure 3C:
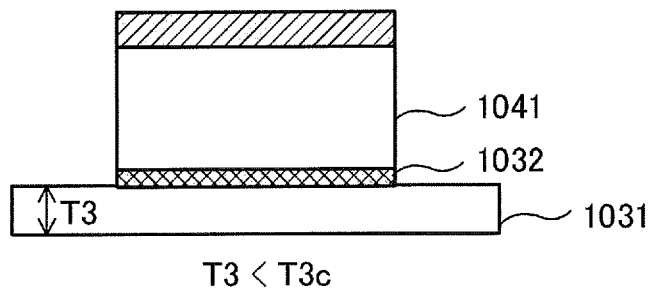

The etching stop layer 1032 is used in a fabrication process of semiconductor layers. FIGS. 3A to 3C are cross-sectional views showing a fabrication process using the etching stop layer 1032. First, a laminated structure of the P-type gate layer 1031, the etching stop layer 1032 and the cathode layer 1041 is etched by using a resist as a mask as shown in FIG. 3A, and thereby the structure shown in FIG. 3B is obtained.

Subsequently, the etching stop layer 1032 is etched by using etching liquid for the etching stop layer 1032, and thereby the structure shown in FIG. 3C is obtained. In this case, the thickness T3 of the P-type gate layer 1031 can be set thin since the etching liquid for the etching stop layer 1032 does not etch the P-type gate layer 1031.

Figure 4A:
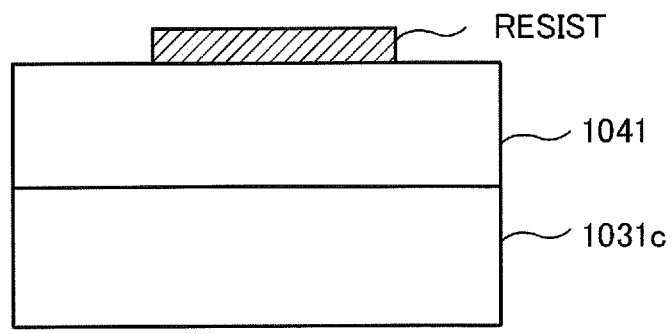
FIGS. 4A and 4B are cross-sectional views showing a fabrication process using no etching stop layer.
Figure 4B:
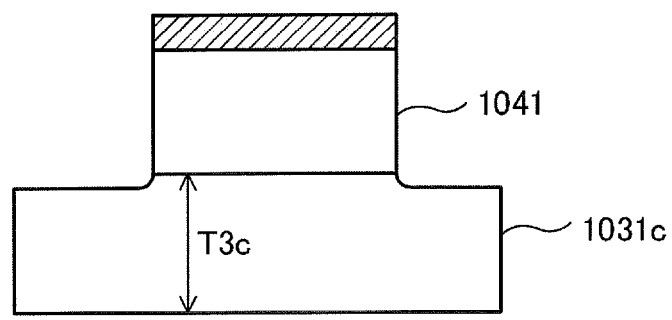

FIGS. 4A and 4B are cross-sectional views showing a fabrication process using no etching stop layer. First, a laminated structure of a P-type gate layer 1031c and the cathode layer 1041 is etched by using a resist as a mask as shown in FIG. 4A, and thereby the structure shown in FIG. 4B is obtained. In this case, the thickness T3c of the P-type gate layer 1031c is designed to be thicker than the thickness T3 in FIG. 3C since etching liquid for the cathode layer 1041 etches the P-type gate layer 1031c.

Each of the anode electrode 61A, the gate electrode 51 and the cathode electrode 41K shown in FIG. 1 and FIG. 2 is, for example, a metal or an alloy which is capable of forming an ohmic contact with AlGaAs or a laminated structure of some of such a metal and an alloy. The metal is, for example, Ti (titanium), Pt (platinum), Au (gold), Ge (germanium), Ni (nickel), Zn (zinc) or the like. The alloy is alloy of some of these metals. The laminated structure is a laminated structure of metals, a laminated structure of alloys, or a laminated structure of metal(s) and alloy(s). The insulation film 71 is an inorganic insulation film such as a SiN (silicon nitride) film or a $SiO_2$ (silicon dioxide) film, or an organic insulation film such as a polyimide film.

In the first embodiment, a dopant concentration Nae of the active layer 1012 is higher than or equal to a dopant concentration Npg of the third semiconductor layer 1030. Further, the band gap BGae of the active layer 1012 is narrower than or equal to the band gap BGng of the second semiconductor layer 1020 and narrower than or equal to the band gap BGpg of the third semiconductor layer 1030. Furthermore, the thickness T3 of the third semiconductor layer 1030 is thinner than the thickness T2 of the second semiconductor layer 1020. Moreover, a dopant concentration Nng of the second semiconductor layer 1020 is lower than the dopant concentration Npg of the third semiconductor layer 1030.

Namely, the light-emitting thyristor according to the first embodiment satisfies the following conditions (1) to (5):

$$Nae \geq Npg \quad (1)$$

$$BGae \leq BGng \quad (2)$$

$$BGae \leq BGpg \quad (3)$$

$$T2 > T3 \quad (4)$$

$$Nng < Npg \quad (5)$$

The conditions (2) and (3) are equivalent to a condition that an Al composition ratio Cae of the active layer 1012 is lower than or equal to an Al composition ratio Cng of the second semiconductor layer 1020 and lower than or equal to an Al composition ratio Cpg of the third semiconductor layer 1030. Thus, the conditions (2) and (3) can be replaced with the following conditions (6) and (7):

$$Cae \leq Cng \quad (6)$$

$$Cae \leq Cpg \quad (7)$$

Figure 5:
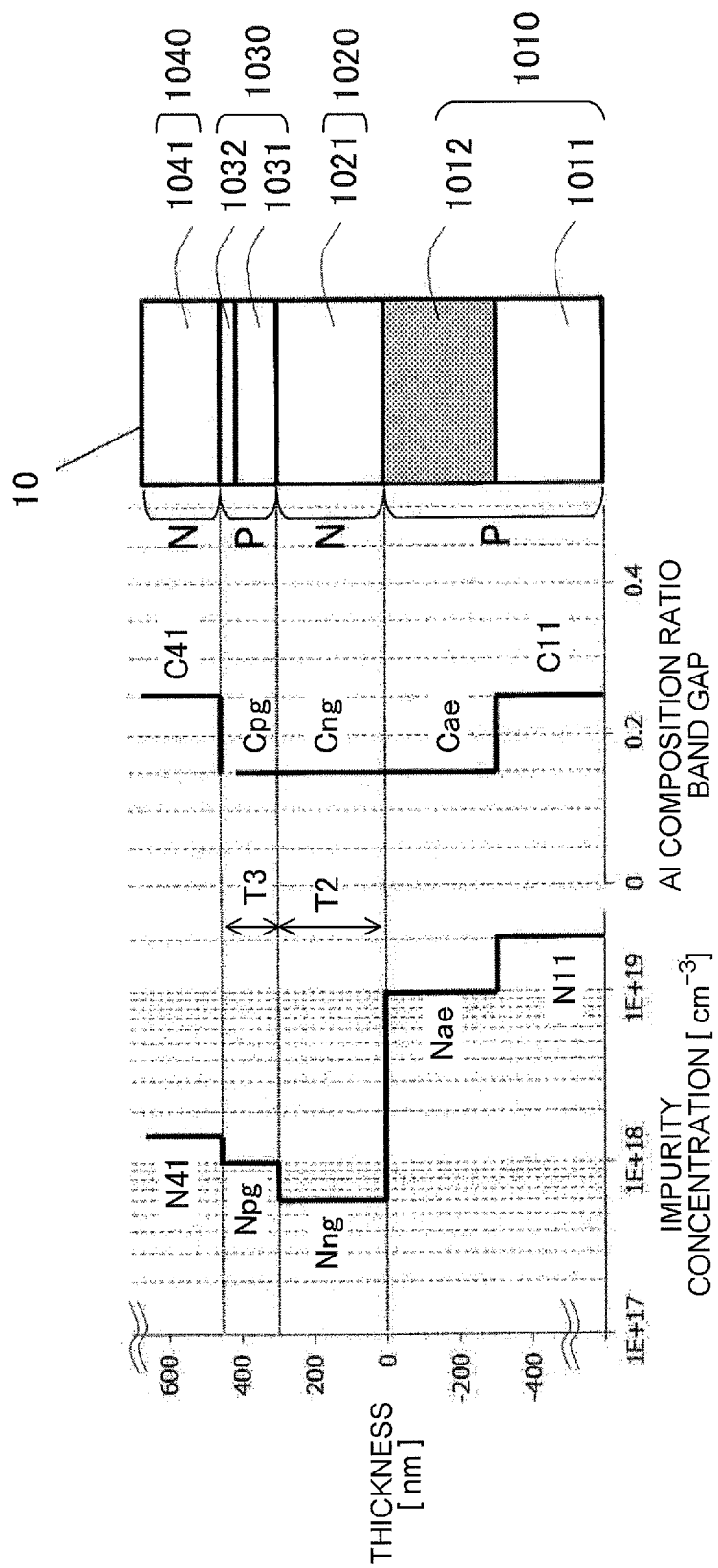
FIG. 5 is a diagram showing an example of a dopant concentration, a thickness and an Al composition ratio of each semiconductor layer of the light-emitting thyristor according to the first embodiment.

FIG. 5 is a diagram showing an example of the dopant concentration ($cm^{-3}$), the thickness (nm) and the Al (aluminum) composition ratio of each semiconductor layer of the light-emitting thyristor 10. The band gap of AlGaAs is proportional to the Al composition ratio of AlGaAs.

In the light-emitting thyristor 10 according to the first embodiment, the Al composition ratio Cae of the active layer 1012 is set equal to the Al composition ratio Cpg of the P-type gate layer 1031 and the Al composition ratio Cng of the N-type gate layer 1021, and set lower than the Al composition ratio C11 of the anode layer 1011 and the Al composition ratio C41 of the cathode layer 1041. Namely, in the light-emitting thyristor 10 according to the first embodiment, the following condition (8) holds:

$$Cae = Cpg = Cng < C11 \text{ (or } C41) \quad (8)$$

Further, to reduce contact resistance, the dopant concentration N11 of the anode layer 1011 is set at $5 \times 10^{18}$ $cm^{-3}$ (=5E+18 $cm^{-3}$) and the dopant concentration N41 of the cathode layer 1041 is set at $1.5 \times 10^{18}$ $cm^{-3}$ (=1.5E+18 $cm^{-3}$).

Figure 6:
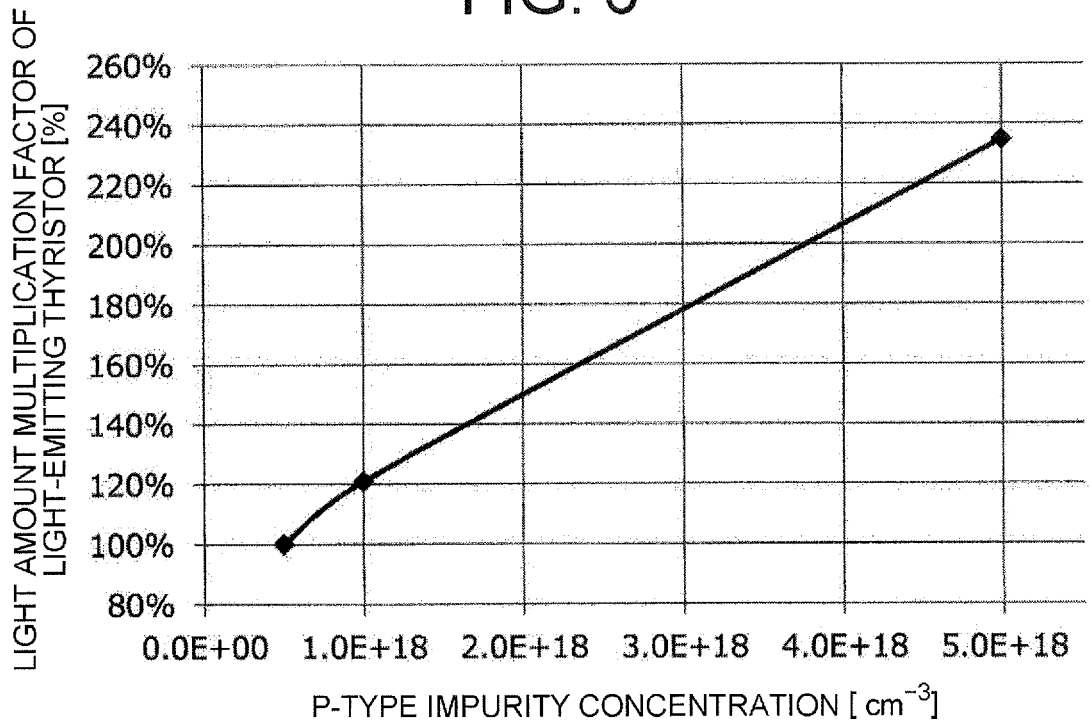
FIG. 6 is a diagram showing the relationship between a P-type dopant concentration of an active layer and the light amount of the light-emitting thyristor.

FIG. 6 is a diagram showing the relationship between a P-type dopant concentration ($cm^{-3}$) of the active layer 1012 and the light amount of the light-emitting thyristor 10. It can be seen from FIG. 6 that a light amount multiplication factor (%) representing the change in the amount of light emitted from the light-emitting thyristor 10 increases proportionally to the dopant concentration Nae ($cm^{-3}$) of the active layer 1012. Therefore, in the first embodiment, the dopant concentration Nae of the active layer 1012 is set at $1 \times 10^{19}$ $cm^{-3}$ (=1E+19 $cm^{-3}$) as shown in FIG. 5.

Figure 7:
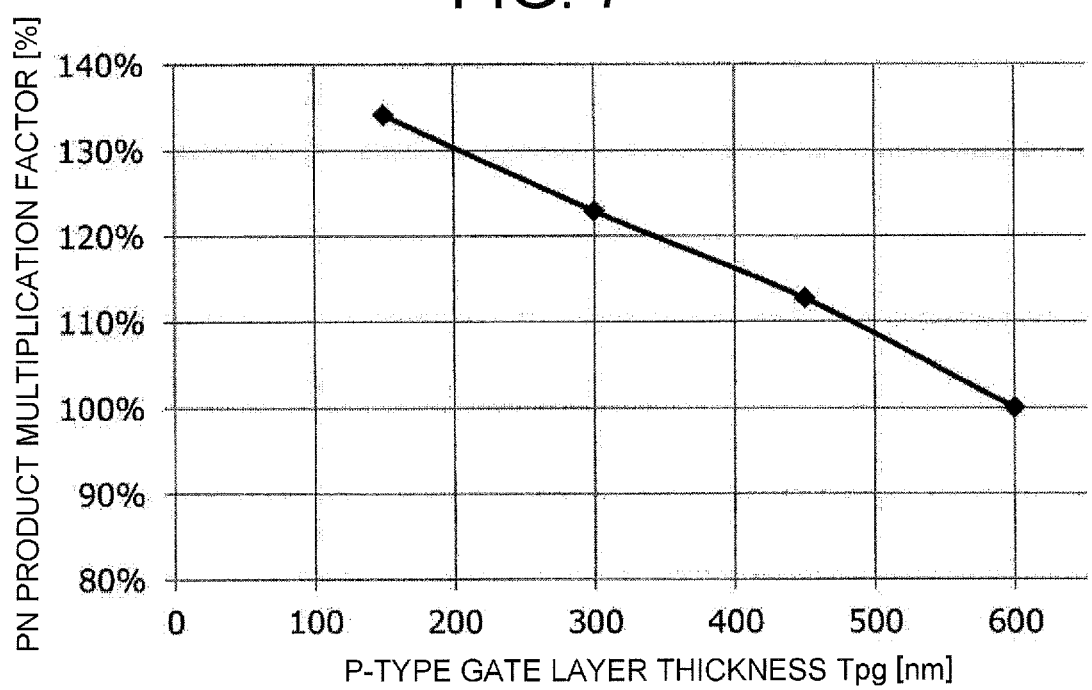
FIG. 7 is a diagram showing the relationship between a multiplication factor (%) of a pn product as the product of an electron concentration n and a hole concentration p in the active layer and the thickness (nm) of a P-type gate layer in a P-type emitter light emission type thyristor.

FIG. 7 is a diagram showing the relationship between a multiplication factor (%) of a pn product as the product of an electron concentration n and a hole concentration p in the active layer 1012 and the thickness Tpg (nm) of the P-type gate layer 1031 in the light-emitting thyristor 10 according to the first embodiment as a P-type emitter light emission type thyristor. In the first embodiment, the thickness Tpg is the thickness T3 shown in FIG. 5. The light emission in the light-emitting thyristor is caused by recombination of an electron and a hole, and the recombination probability is proportional to the multiplication factor of the pn product. The pn product multiplication factor in FIG. 7 does not change even if the P-type dopant concentration Npg of the P-type gate layer 1031 and the P-type dopant concentration Nae of the active layer 1012 are changed. Thus, in a case where the light-emitting thyristor 10 is provided with the active layer 1012 as a P-type emitter, it can be understood that the light amount increases proportionally to the multiplication factor of the pn product if the thickness Tpg (=T3) of the P-type gate layer 1031 is set thin. For this reason, the thickness Tpg of the P-type gate layer 1031 is 150 nm. Accordingly, in order to secure the stability of the fabrication process, the etching stop layer 1032 is provided immediately above the P-type gate layer 1031.

Subsequently, when the thickness Tpg of the P-type gate layer 1031 is 150 nm, the dopant concentration Npg of the P-type gate layer which can secure sufficient withstand voltage performance is determined. The widths of depletion layers in one PN junction can be calculated by using the following expressions (9) and (10):

$$X_n = \sqrt{\frac{2\varepsilon N_A (V_{bi} - V)}{q N_D (N_D + N_A)}} \quad (9)$$

$$X_P = \sqrt{\frac{2\varepsilon N_D (V_{bi} - V)}{q N_a (N_D + N_A)}} \quad (10)$$

Here, $X_n$ and $X_p$ represent the widths of the depletion layers extending respectively on an N-type layer's side and a P-type layer's side of the PN junction, $N_D$ and $N_A$ represent a donor concentration and an acceptor concentration, ε represents a dielectric constant, q represents the elementary charge, $V_{bi}$ represents built-in potential, and V represents external voltage. The external voltage is positive when it is in the forward direction of the PN junction.

The expression (9) indicates that the width $X_n$ of the depletion layer extending on the N-type layer's side increase with the decrease in the concentration of N-type impurities as donors and with the increase in the concentration of P-type impurities as acceptors in the N-type layer, and the expression (10) indicates an inverse phenomenon with regard to $X_p$. Further, in the expressions (9) and (10), the widths $X_n$ and $X_p$ of the depletion layers increase when reverse direction voltage is increased. For example, when forward direction voltage is applied between the anode electrode 61A and the gate electrode 51 in FIG. 2, voltage in the reverse direction is applied to the PN junction between the P-type gate layer and the N-type gate layer. When a depletion layer expanding due to the voltage in the reverse direction connects with a depletion layer in the vicinity of the junction and on the opposite side, the punch-through occurs and electrical conduction is established between the anode and the gate. Therefore, in order to secure sufficient withstand voltage performance, the thickness Tpg (=T3) is set greater than the sum total of the width of a depletion layer on a P-type gate layer's side in a PN junction between the P-type gate layer and the N-type gate layer when forward direction voltage is applied between the anode and the gate and the width of a depletion layer on a P-type gate layer's side in a PN junction between the P-type gate layer and the N-type cathode layer when the voltage between the P-type gate layer and the N-type cathode layer is 0 V. For example, in consideration of the dopant concentration Nng being as high as $1 \times 10^{18}$ cm$^{-3}$ and variations occurring at the time of the growth of the semiconductor layers, the dopant concentration Npg is set at $1 \times 10^{18}$ cm$^{-3}$ as the dopant concentration of the P-type gate layer 1031 whose withstand voltage is 8 V or higher.

Finally, the dopant concentration Npg and the thickness Tpg (=T3) of the P-type gate layer 1031, which is capable of reducing breakover voltage Vb necessary for turning on the light-emitting thyristor 10 while sufficient withstand voltage performance is secured, are determined. The breakover voltage Vb is voltage necessary for turning on the light-emitting thyristor 10. The dopant concentration $N_B$ of a base layer (namely, a gate layer in the light-emitting thyristor 10) is increased or a base width $W_B$ is increased, and thereby current amplification factors $\beta_1$ and $\beta_2$ decrease. As the current amplification factors $\beta_1$ and $\beta_2$ decrease, the breakover voltage Vb necessary for turning on the light-emitting thyristor 10 increases. Since the breakover voltage Vb has to be set lower than drive voltage supplied from a drive circuit for driving the light-emitting thyristor 10, the current amplification factors $\beta_1$ and $\beta_2$ have to be set rather high. In regard to a PNP transistor part and an NPN transistor part in the light-emitting thyristor 10, the current amplification factors $\beta_1$ and $\beta_2$ can be respectively determined according to the following expressions (11) and (12):

$$\beta_1 = \frac{1}{\frac{W_B^2}{L_B^2} + \frac{D_B N_B W_B}{D_E N_E W_E}} \quad (11)$$

$$\beta_2 = \frac{1}{\frac{W_B^2}{L_B^2} + \frac{D_B N_B W_B}{D_E N_E W_E}} \quad (12)$$

Here, the base width $W_B$ in the expressions (11) and (12) is a value obtained by subtracting the sum total of the widths $X_n$ and $X_p$ of the depletion layers from the thickness Tng (=T2) of the N-type gate layer 1021. Thus, if the thickness Tng of the N-type gate layer 1021 is set at a constant multiple of the width of a depletion layer, the base width $W_B$ is determined from the dopant concentration Nng. It has been confirmed by experiments that the breakover voltage Vb has negative correlation with each of the current amplification factors $\beta_1$ and $\beta_2$. Further, the breakover voltage Vb is considered to have negative correlation with a composite function β of the current amplification factors. Thus, the composite function β is considered to be obtained according to the following expression (13):

$$\beta = \alpha \beta_1 \beta_2 \quad (13)$$

Figure 8:
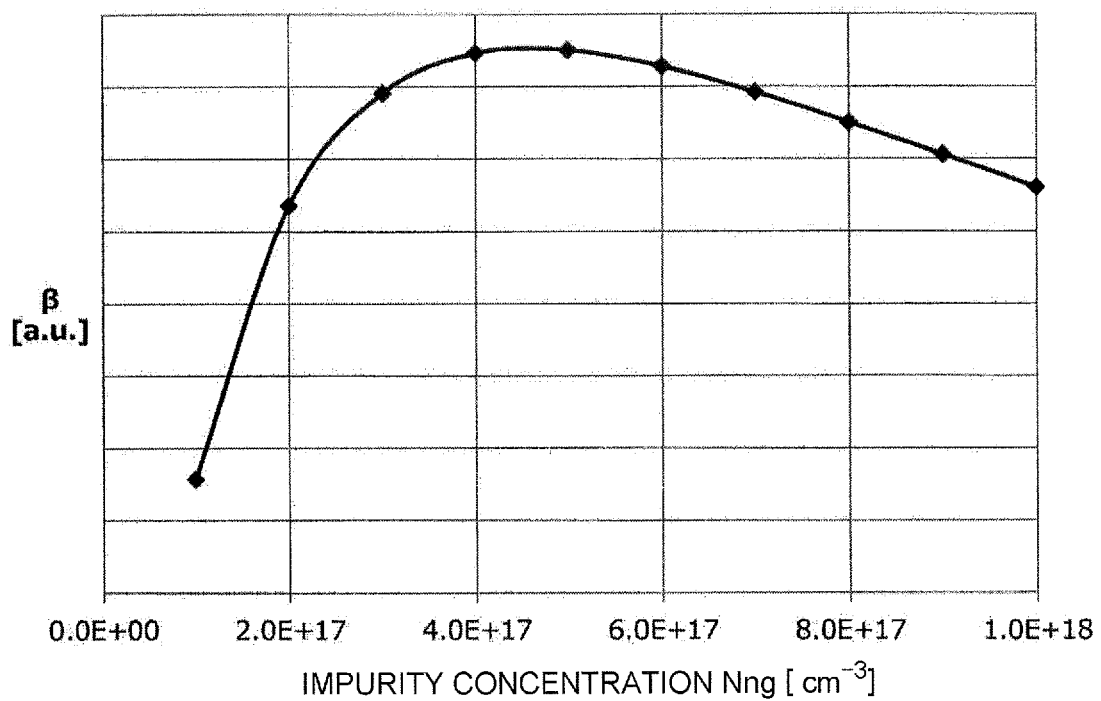
FIG. 8 is a diagram showing a composite function of current amplification factors when a dopant concentration is changed.

Here, the coefficient a is an arbitrary constant. In this case, a result was obtained as shown in FIG. 8 in which the composite function β of the current amplification factors had a local maximum value with regard to a change of the dopant concentration Nng of the N-type gate layer 1021. Accordingly, the dopant concentration Nng of the N-type gate layer 1021 is set at $5 \times 10^{17}$ cm$^{-3}$ and the thickness Tng (=T2) of the N-type gate layer 1021 is set at 300 nm as shown in FIG.

5. Incidentally, Nk (N41 in FIG. 5) represents the dopant concentration of the cathode layer 1041 and Nae represents the dopant concentration of the active layer 1012.

The light-emitting thyristor 10 according to the first embodiment is not limited to the structure shown in FIG. 5. In the light-emitting thyristor 10 according to the first embodiment, if the following conditions (14) to (19) are satisfied, the composite function β of the current amplification factors can be made larger compared to that in conventional technology while withstand voltage of 8 V or higher is secured.

$$150 \text{ nm} \leq Tpg (=T3) \leq 180 \text{ nm} \quad (14)$$

$$270 \text{ nm} \leq Tng (=T2) \leq 330 \text{ nm} \quad (15)$$

$$1.2 \times 10^{18} \text{ cm}^{-3} \leq Nk \leq 1.8 \times 10^{18} \text{ cm}^{-3} \quad (16)$$

$$8 \times 10^{17} \text{ cm}^{-3} \leq Npg \leq 1.2 \times 10^{18} \text{ cm}^{-3} \quad (17)$$

$$4 \times 10^{17} \text{ cm}^{-3} \leq Nng \leq 6 \times 10^{17} \text{ cm}^{-3} \quad (18)$$

$$1.2 \times 10^{18} \text{ cm}^{-3} \leq Nae \leq 1.5 \times 10^{19} \text{ cm}^{-3} \quad (19)$$

The light-emitting thyristor 10 according to the first embodiment satisfies the following conditions (20) and (21):

$$Tpg < Tng \quad (20)$$

$$Nng < Npg \leq Nae \quad (21)$$

(1-2) Operation

In the light-emitting thyristor 10 according to the first embodiment, an electric current is sent from the gate electrode 51 to the cathode electrode 41K and thereby electrical conduction is established between the anode electrode 61A and the cathode electrode 41K. In this case, a hole and an electron recombine with each other in the P-type active layer 1012. At that time, although similar recombination occurs also in the N-type gate layer 1021 and the P-type gate layer 1031, the recombination occurs in the active layer 1012 with high probability since the dopant concentration Nng in the N-type gate layer 1021 is set low and the thickness Tpg of the P-type gate layer 1031 is set thin. Light generated by the recombination is emitted through the cathode layer 1041.

(1-3) Effect

In the light-emitting thyristor 10 according to the first embodiment, the composite function β of the current amplification factors becomes large while sufficient withstand voltage performance is secured by the calculations described above, and thereby the breakover voltage Vb can be reduced. Further, since the N-type gate layer 1021 and the P-type gate layer 1031 serve also as absorptive layers that absorb the light generated in the active layer 1012, light extraction efficiency can be increased by reducing the thicknesses of these layers. With the above-described features, in the light-emitting thyristor 10 according to the first embodiment, the breakover voltage Vb decreases and luminous efficiency increases.

Further, in the case of the comparative example using no etching stop layer 1032 in the fabrication process, the thickness of the P-type gate layer 1031 has to be set as thick as approximately 400 nm and the breakover voltage Vb also increases to 5.44 V. In contrast, in the light-emitting thyristor 10 according to the first embodiment, since the etching stop layer 1032 is used in the fabrication process, the thickness of the P-type gate layer 1031 can be set as thin as 150 nm, the breakover voltage Vb can be lowered to 2.56 V, and the emission light amount can be increased to 152% relative to the comparative example.

Incidentally, the above description has been given of the example in which semiconductor layers are stacked upward from the substrate part 101 in the order of PNPN, the etching stop layer 1032 is provided immediately above the P-type gate layer 1031, the Al composition ratios of the active layer 1012, the N-type gate layer 1021 and the P-type gate layer 1031 are equal to each other, and the gate electrode 51 is connected to the P-type gate layer 1031. However, it is also possible to employ a different structure such as a structure including no etching stop layer 1032.

(1-4) First Modification of First Embodiment

Figure 9:
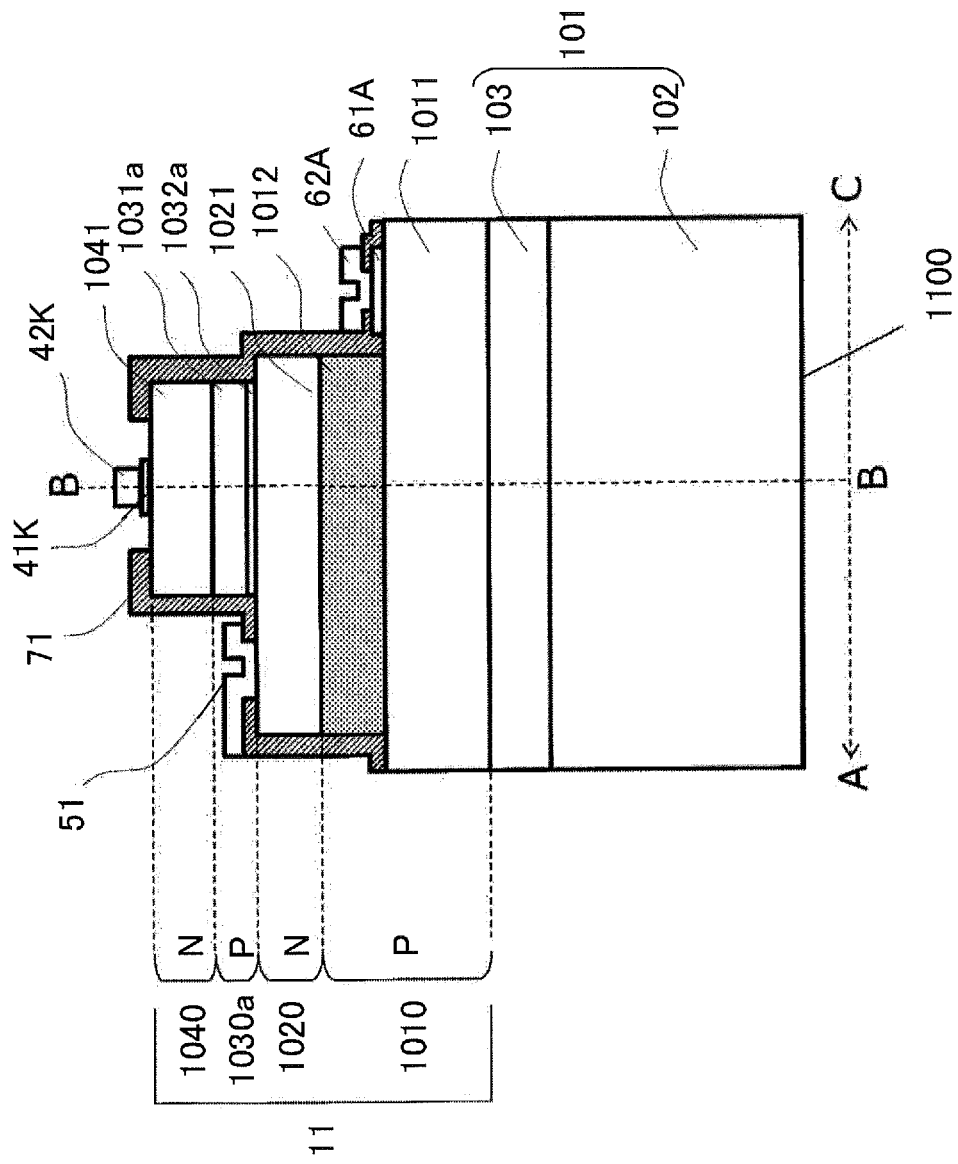
FIG. 9 is a schematic cross-sectional view showing the cross-sectional structure of a light-emitting thyristor according to a first modification of the first embodiment.
Figure 10:
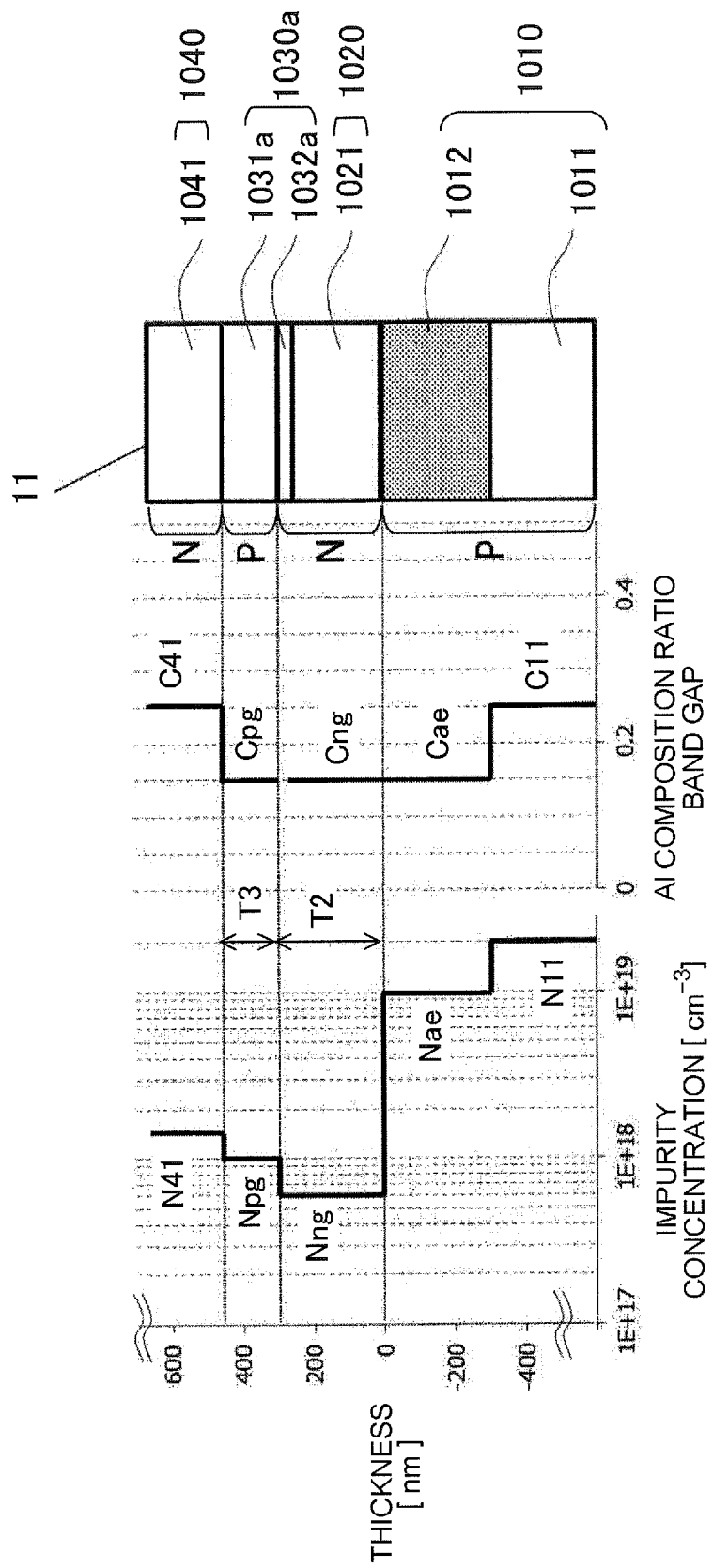
FIG. 10 is a diagram showing an example of the dopant concentration, the thickness and the Al composition ratio of each semiconductor layer of the light-emitting thyristor according to the first modification of the first embodiment.

FIG. 9 is a schematic cross-sectional view showing the cross-sectional structure of a light-emitting thyristor 11 according to a first modification of the first embodiment. FIG. 10 is a diagram showing an example of the dopant concentration (cm$^{-3}$), the thickness (nm) and the Al composition ratio of each semiconductor layer of the light-emitting thyristor 11. The light-emitting thyristor 11 and a semiconductor device 1100 differ from the light-emitting thyristor 10 and the semiconductor device 1000 in that a third semiconductor layer 1030a includes a P-type gate layer 1031a and an etching stop layer 1032a and in that the gate electrode 51 is connected to the N-type gate layer 1021. In regard to the other features, the light-emitting thyristor 11 and the semiconductor device 1100 are the same as the light-emitting thyristor 10 and the semiconductor device 1000.

(1-5) Second Modification of First Embodiment

Figure 11:
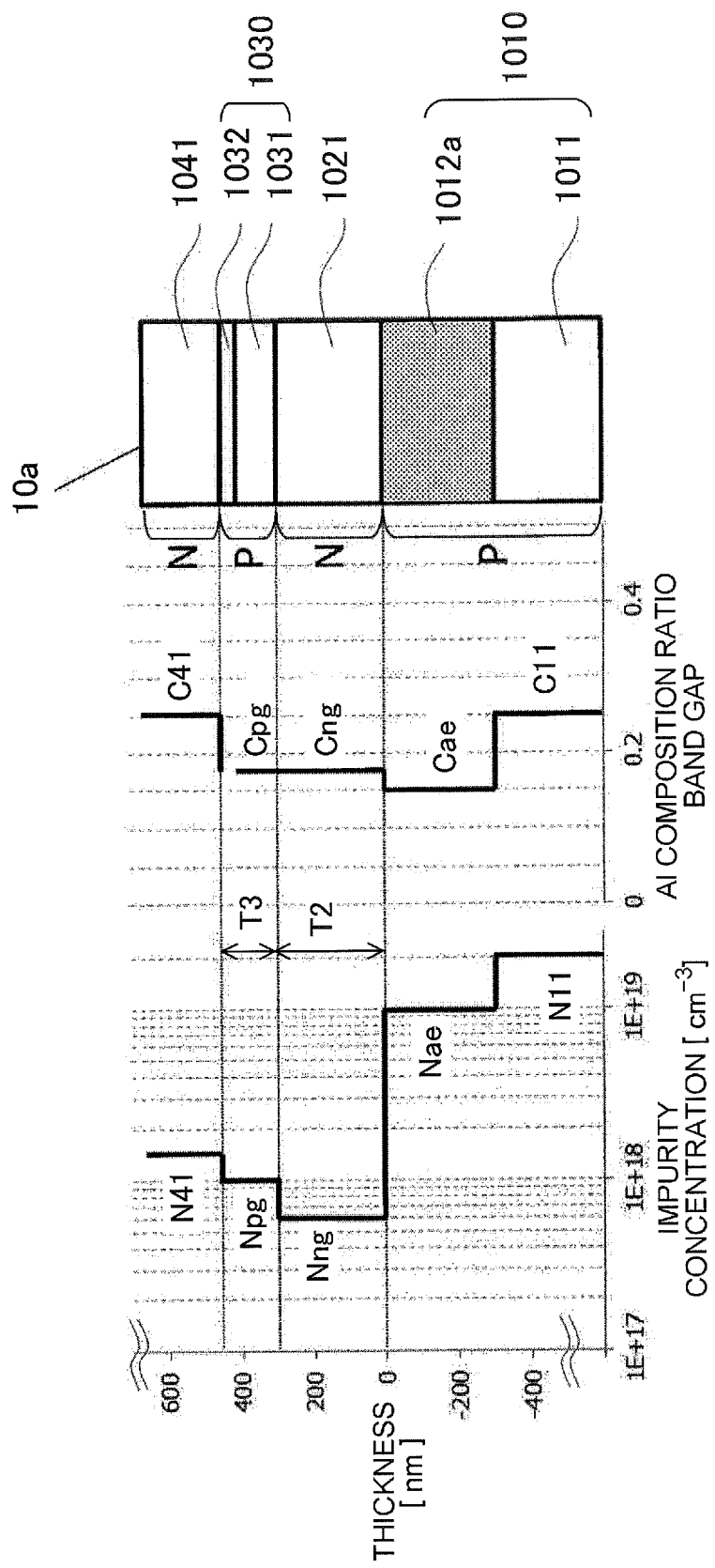
FIG. 11 is a diagram showing an example of the dopant concentration, the thickness and the Al composition ratio of each semiconductor layer of a light-emitting thyristor according to a second modification of the first embodiment.

FIG. 11 is a diagram showing an example of the dopant concentration (cm$^{-3}$), the thickness (nm) and the Al composition ratio of each semiconductor layer of a light-emitting thyristor 10a according to a second modification of the first embodiment. The light-emitting thyristor 10a differs from the light-emitting thyristor 10 in that the Al composition ratio Cpg of the P-type gate layer 1031 and the Al composition ratio Cng of the N-type gate layer 1021 are higher than the Al composition ratio Cae of an active layer 1012a. Even in a case where the Al composition ratios Cng and Cpg of the N-type gate layer 1021 and the P-type gate layer 1031 are set higher than the Al composition ratio Cae of the active layer as shown in FIG. 11, the changes in the built-in potential $V_{bi}$ and the widths $X_n$ and $X_p$ of the depletion layers at the junction between semiconductor layers are minute and sufficient withstand voltage can be secured within the ranges of the thicknesses and the dopant concentrations of the semiconductor layers specified by the aforementioned conditions (14) to (21). In addition, since the transmittance of light increases by increasing the Al composition ratios Cng and Cpg, the light extraction efficiency increases and an advantage of further increasing the light amount is obtained. Except for the above-described features, the light-emitting thyristor 10a is the same as the light-emitting thyristor 10.

(1-6) Third Modification of First Embodiment

Figure 12:
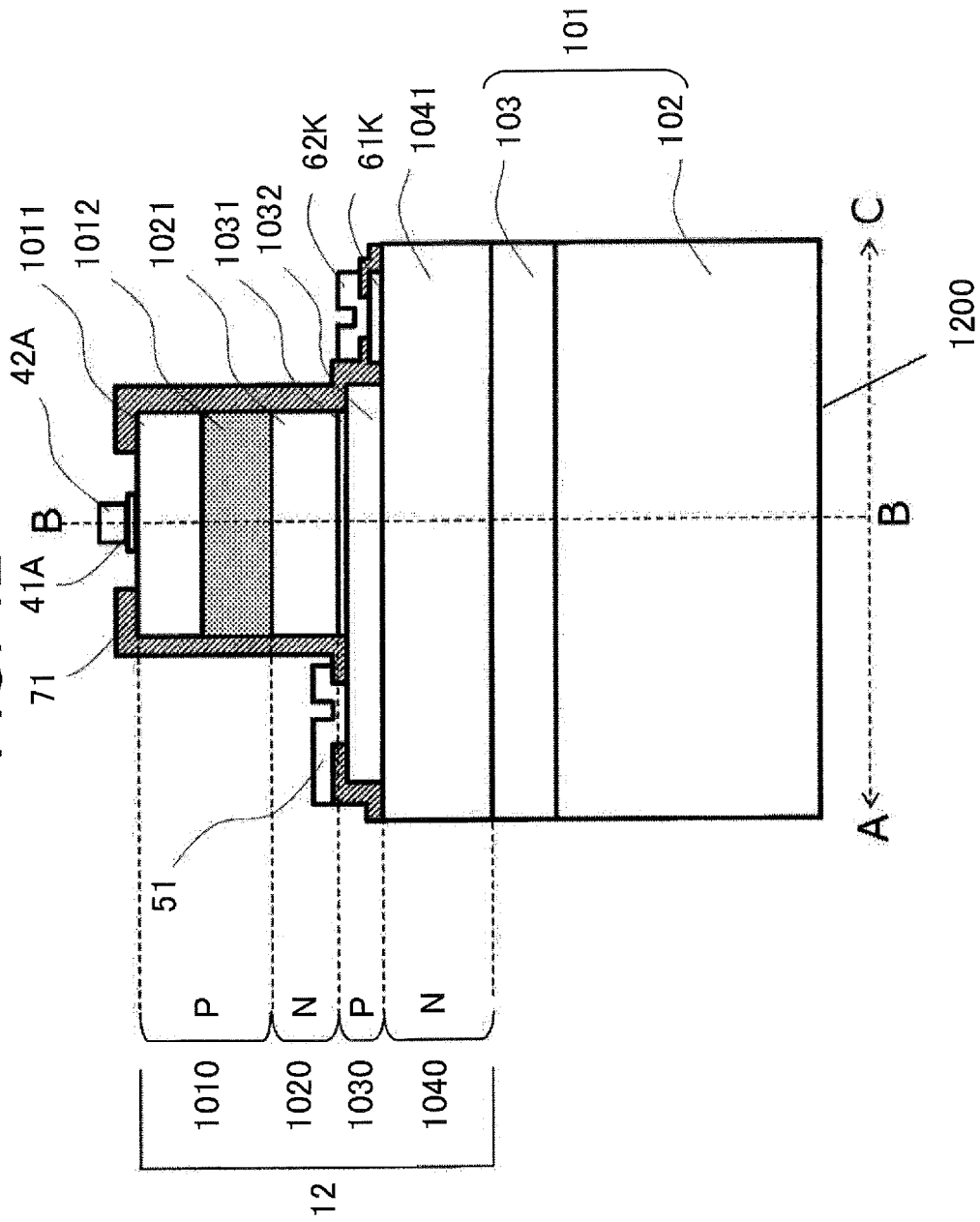
FIG. 12 is a schematic cross-sectional view showing the structure of a light-emitting thyristor according to a third modification of the first embodiment.
Figure 13:
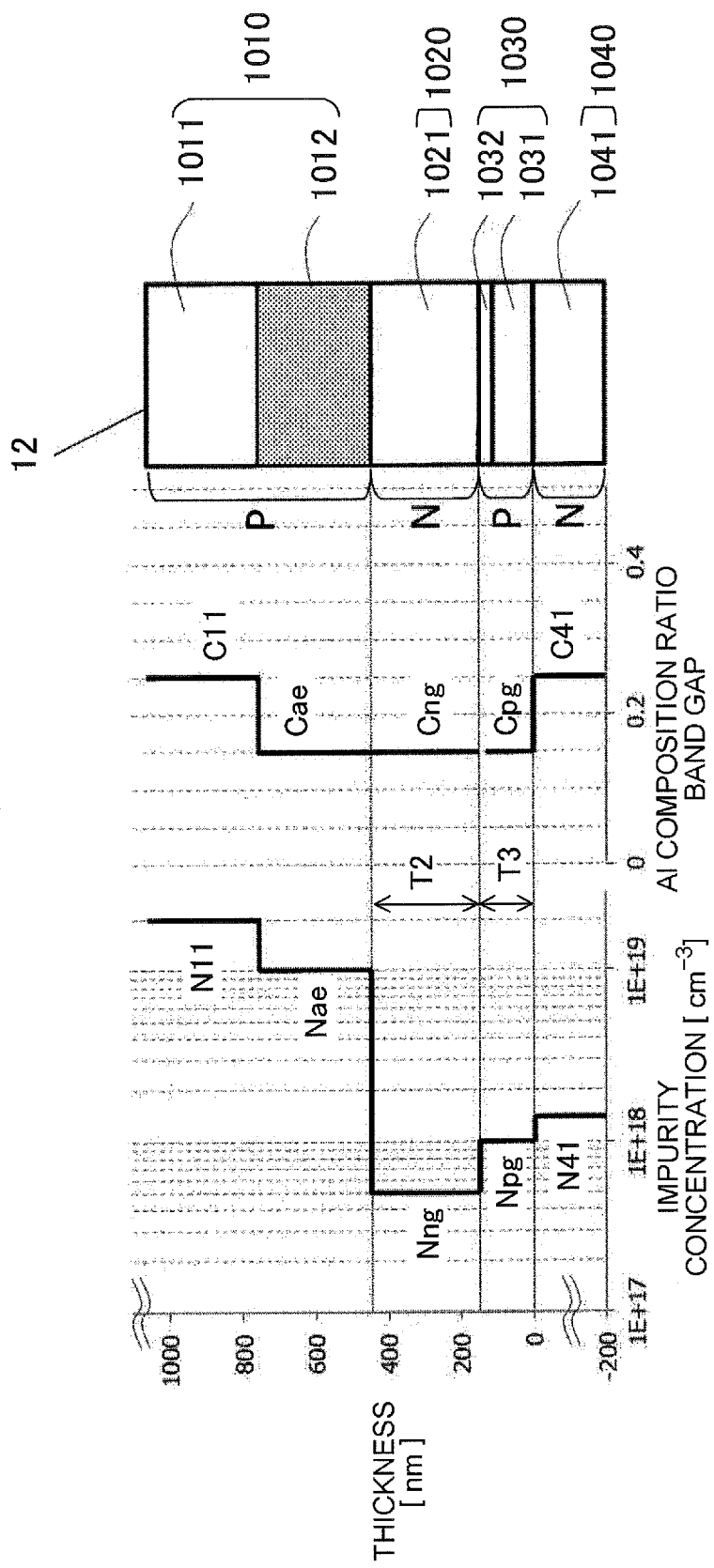
FIG. 13 is a diagram showing an example of the dopant concentration, the thickness and the Al composition ratio of each semiconductor layer of the light-emitting thyristor according to the third modification of the first embodiment.

FIG. 12 is a schematic cross-sectional view showing the cross-sectional structure of a light-emitting thyristor 12 according to a third modification of the first embodiment. FIG. 13 is a diagram showing an example of the dopant concentration (cm$^{-3}$), the thickness (nm) and the Al composition ratio of each semiconductor layer of the light-emitting thyristor 12. The light-emitting thyristor 12 differs from the light-emitting thyristor 10 in that the fourth semiconductor layer 1040, the third semiconductor layer 1030, the second semiconductor layer 1020 and the first semiconductor layer 1010 are stacked on the substrate part 101 in this order from the side of the substrate part 101 and in including an anode electrode 41A, anode wiring 42A, a cathode electrode 61K and cathode wiring 62K. In the light-emitting thyristor 12, since only the anode layer 1011 exists on top of the active layer 1012, absorption of light traveling upward is reduced, the light extraction efficiency increases, and the advantage of further increasing the light amount is obtained. Except for the above-described features, the light-emitting thyristor 12 is the same as the light-emitting thyristor 10.

(2) Second Embodiment (2-1) Configuration

Figure 14:
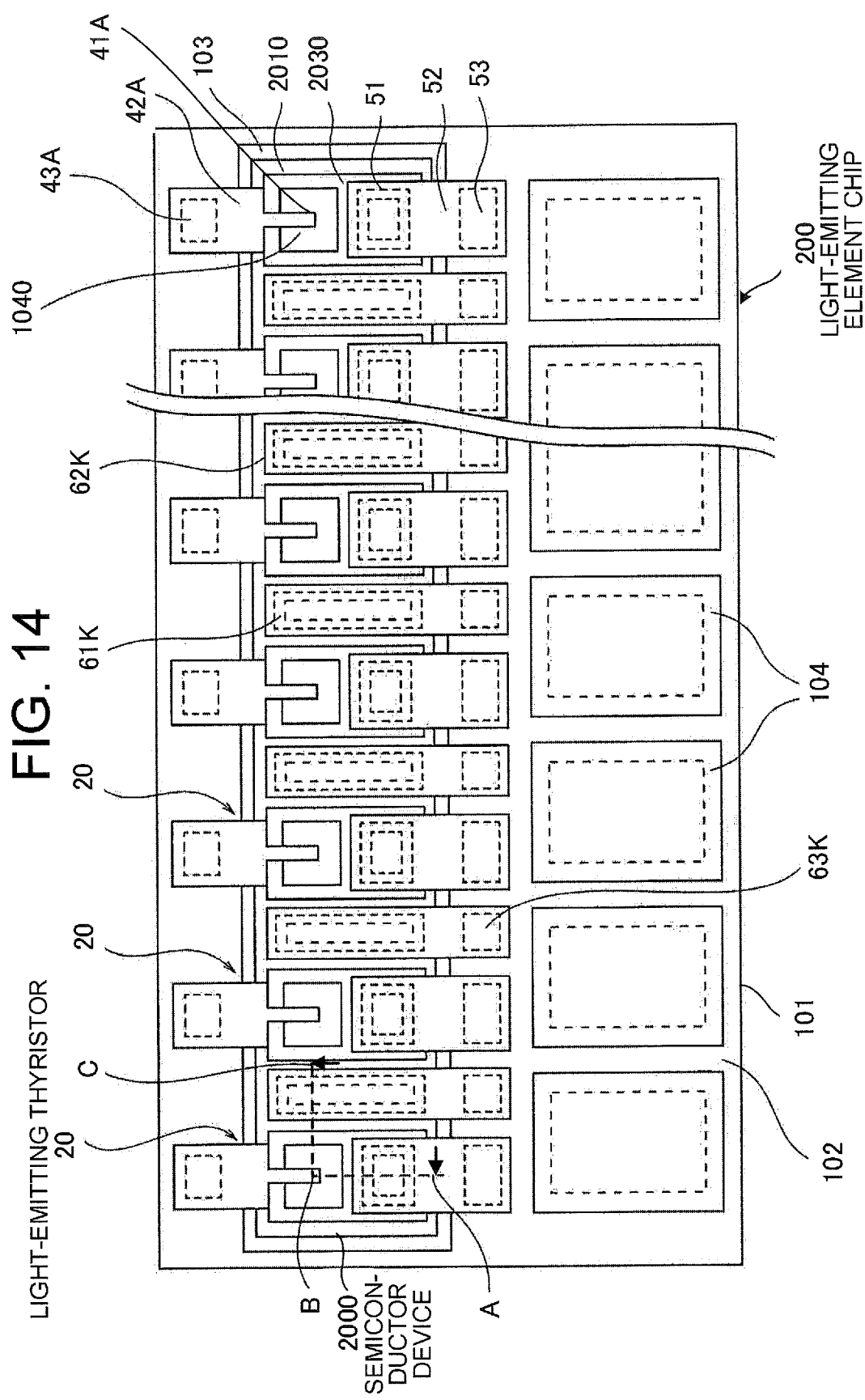
FIG. 14 is a schematic plan view showing the structure of a light-emitting thyristor according to a second embodiment of the present invention.
Figure 15:
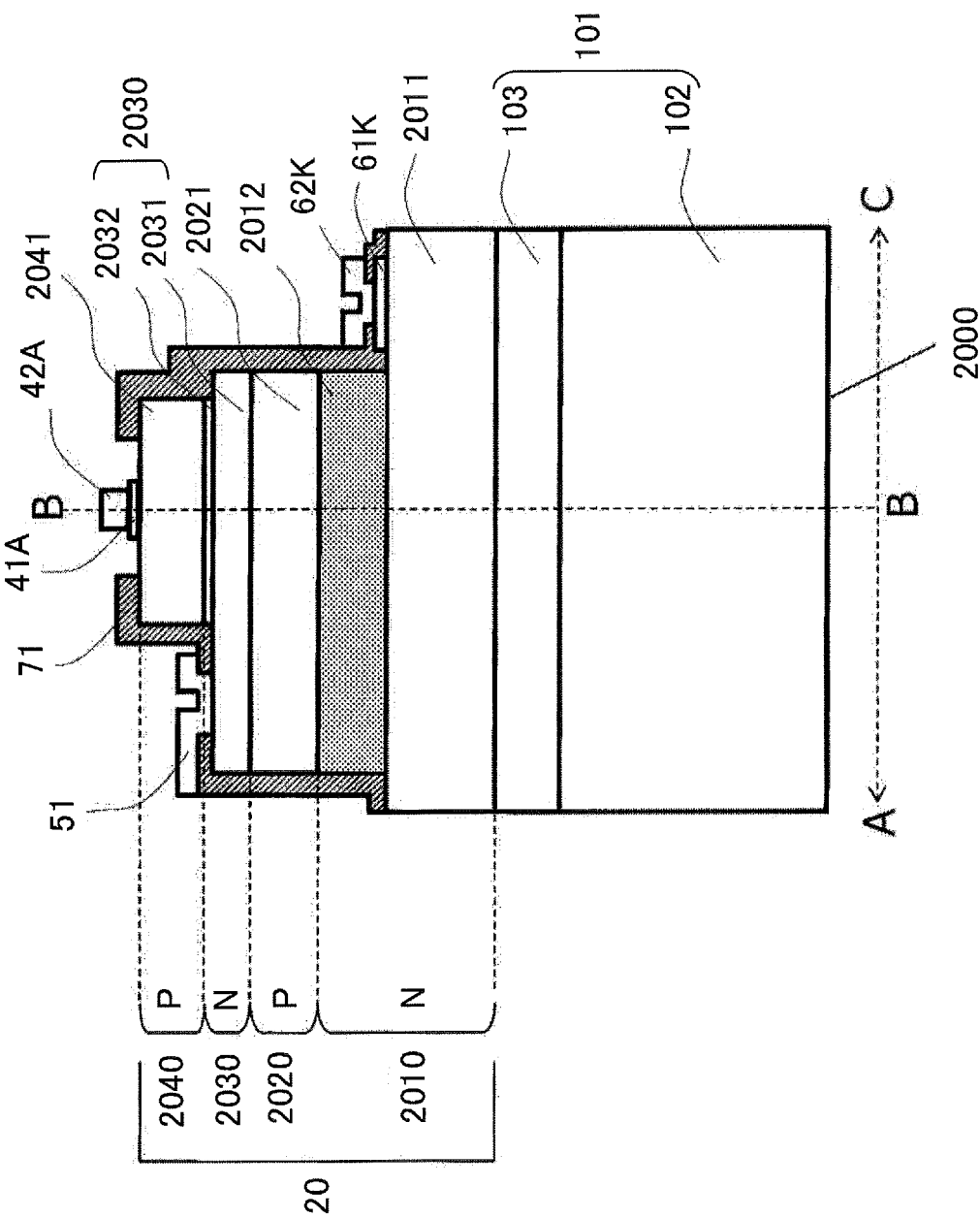
FIG. 15 is a schematic cross-sectional view showing the structure of the light-emitting thyristor according to the second embodiment, namely, the cross-sectional structure at the line A-B-C in FIG. 14.

FIG. 14 is a schematic plan view showing the structure of a light-emitting thyristor 20 according to a second embodiment of the present invention. FIG. 15 is a schematic cross-sectional view showing the structure of the light-emitting thyristor 20. As shown in FIG. 14 and FIG. 15, the light-emitting thyristor 20 includes a first semiconductor layer 2010 of a first conductivity type, a second semiconductor layer 2020 of a second conductivity type different from the first conductivity type arranged adjacent to the first semiconductor layer 2010, a third semiconductor layer 2030 of the first conductivity type arranged adjacent to the second semiconductor layer 2020, and a fourth semiconductor layer 2040 of the second conductivity type arranged adjacent to the third semiconductor layer 2030. In the second embodiment, the first conductivity type is the N type and the second conductivity type is the P type.

Further, as shown in FIG. 15, the light-emitting thyristor 20 includes a cathode electrode 61K as a first electrode electrically connected with the first semiconductor layer 2010, a gate electrode 51 as a second electrode electrically connected with the third semiconductor layer 2030, and an anode electrode 41A as a third electrode electrically connected with the fourth semiconductor layer 2040. The cathode electrode 61K is electrically connected with a cathode terminal of the substrate part 101 by cathode wiring 62K. The gate electrode 51 is electrically connected with a gate terminal 53 (shown in FIG. 14) of the substrate part 101 by gate wiring 52 (shown in FIG. 14). The anode electrode 41A is electrically connected with an anode terminal 43A (shown in FIG. 14) of the substrate part 101 by anode wiring 42A.

The N-type first semiconductor layer 2010 includes a cathode layer 2011 and an N-type active layer 2012 arranged adjacent to the cathode layer 2011. Thus, a part of the first semiconductor layer 2010 is the active layer 2012 adjacent to the second semiconductor layer 2020. The P-type second semiconductor layer 2020 includes a P-type gate layer 2021. The N-type third semiconductor layer 2030 includes an N-type gate layer 2031 and an etching stop layer 2032. The P-type fourth semiconductor layer 2040 includes a P-type anode layer 2041.

In a case where AlGaAs-based semiconductor materials are used for the first to fourth semiconductor layers 2010, 2020, 2030 and 2040, the cathode layer 2011 is, for example, an N-type $Al_{0.25}Ga_{0.75}As$ layer, the active layer 2012 is, for example, an N-type $Al_{0.15}Ga_{0.85}As$ layer, the P-type gate layer 2021 is, for example, a P-type $Al_{0.15}Ga_{0.85}As$ layer, the N-type gate layer 2031 is, for example, an N-type $Al_{0.15}Ga_{0.85}As$ layer, and the anode layer 2041 is, for example, a P-type $Al_{0.25}Ga_{0.75}As$ layer. The etching stop layer 2032 is, for example, an N-type $In_{0.49}Ga_{0.51}P$ layer.

In the second embodiment, the dopant concentration Nae of the active layer 2012 is higher than or equal to the dopant concentration Nng of the third semiconductor layer 2030. Further, the band gap BGae of the active layer 2012 is narrower than or equal to the band gap BGpg of the second semiconductor layer 2020 and narrower than or equal to the band gap BGng of the third semiconductor layer 2030. Furthermore, the thickness T3 of the third semiconductor layer 2030 is thinner than the thickness T2 of the second semiconductor layer 2020. Moreover, the dopant concentration Npg of the second semiconductor layer 2020 is lower than the dopant concentration Nng of the third semiconductor layer 2030.

Namely, the light-emitting thyristor according to the second embodiment satisfies the following conditions (1a), (2) to (4) and (5a):

$$Nae \geq Nng \quad (1a)$$

$$BGae \leq BGng \quad (2)$$

$$BGae \leq BGpg \quad (3)$$

$$T2 > T3 \quad (4)$$

$$Npg < Nng \quad (5a)$$

The conditions (2) and (3) are equivalent to a condition that an Al composition ratio Cae of the active layer 2012 is lower than or equal to an Al composition ratio Cpg of the second semiconductor layer 2020 and lower than or equal to an Al composition ratio Cng of the third semiconductor layer 2030. Thus, the conditions (2) and (3) can be replaced with the following conditions (6) and (7):

$$Cae \leq Cng \quad (6)$$

$$Cae \leq Cpg \quad (7)$$

Figure 16:
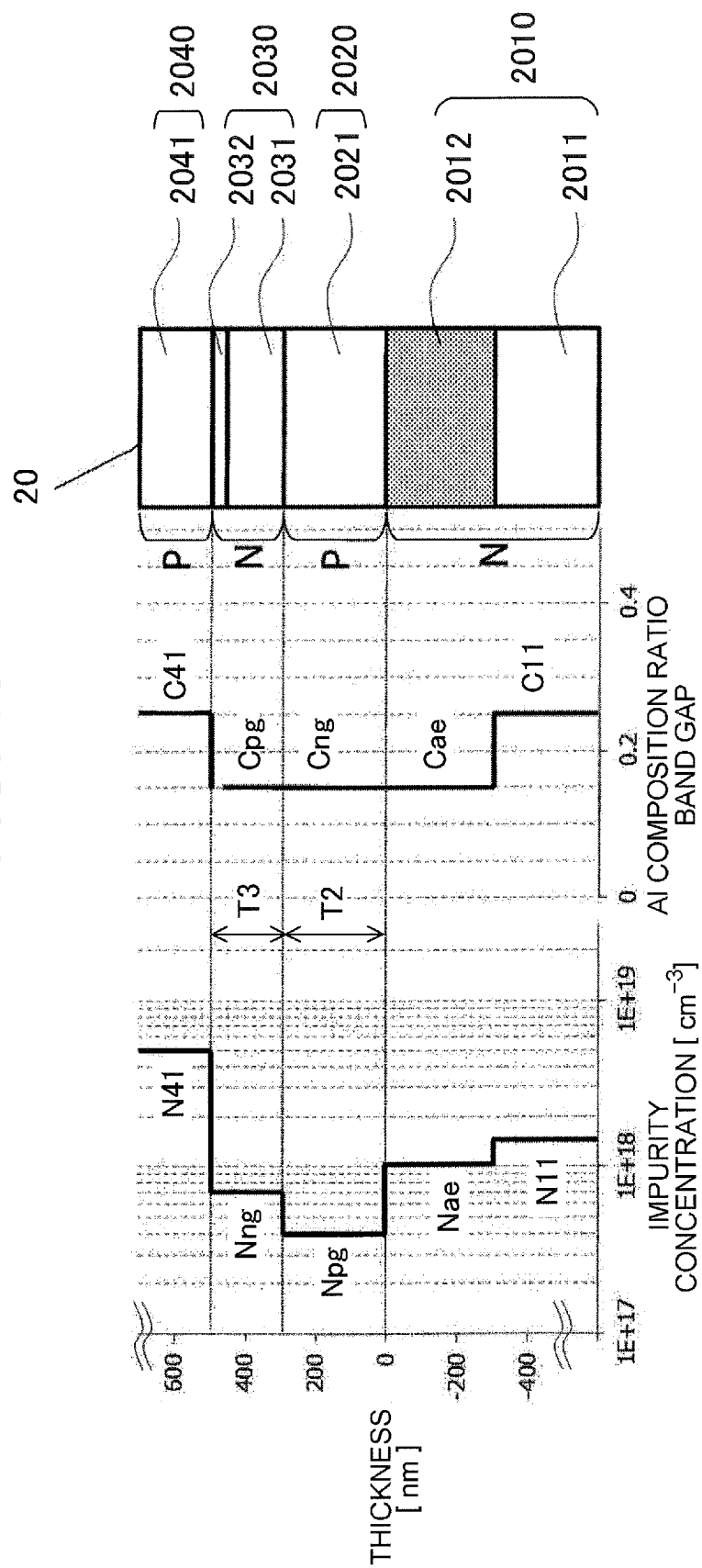
FIG. 16 is a diagram showing an example of the dopant concentration, the thickness and the Al composition ratio of each semiconductor layer of the light-emitting thyristor according to the second embodiment.

FIG. 16 is a diagram showing an example of the dopant concentration ($cm^{-3}$), the thickness (nm) and the Al composition ratio of each semiconductor layer of the light-emitting thyristor 20.

In the light-emitting thyristor 20 according to the second embodiment, the Al composition ratio Cae of the active layer 2012 is set equal to the Al composition ratio Cng of the N-type gate layer 2031 and the Al composition ratio Cpg of the P-type gate layer 2021, and set lower than the Al composition ratio C11 of the cathode layer 2011 and the Al composition ratio C41 of the anode layer 2041. Namely, in the light-emitting thyristor 20 according to the second embodiment, the following condition (8) holds:

$$Cae = Cpg = Cng < C11 \text{ (or C41)} \quad (8)$$

The light-emitting thyristor 20 according to the second embodiment is not limited to the structure shown in FIG. 16. In the light-emitting thyristor 20 according to the second embodiment, if the following conditions (22) to (29) are satisfied, the composite function β of the current amplification factors can be made larger compared to that in conventional technology while withstand voltage of 8 V or higher is secured.

$$180 \text{ nm} \leq Tng (=T3) \leq 220 \text{ nm} \quad (22)$$

$$270 \text{ nm} \leq Tpg (=T2) \leq 330 \text{ nm} \quad (23)$$

$$4 \times 10^{18} \text{ cm}^{-3} \leq Na \leq 6 \times 10^{18} \text{ cm}^{-3} \quad (24)$$

$$7 \times 10^{17} \text{ cm}^{-3} \leq Nng \leq 1 \times 10^{18} \text{ cm}^{-3} \quad (25)$$

$$4 \times 10^{17} \text{ cm}^{-3} \leq Npg \leq 6 \times 10^{17} \text{ cm}^{-3} \quad (26)$$

$$1 \times 10^{18} \text{ cm}^{-3} \leq Nae \leq 1.5 \times 10^{18} \text{ cm}^{-3} \quad (27)$$

Within the above ranges, the composite function β of the current amplification factors can be made larger compared to that in conventional technology while withstand voltage of 8 V or higher is secured.

The light-emitting thyristor 20 according to the second embodiment satisfies the following conditions (28) and (29):

$$Tng < Tpg \quad (28)$$

$$Npg < Nng \leq Nae \quad (29)$$

(2-2) Operation

In the light-emitting thyristor 20 according to the second embodiment, an electric current is sent from the anode electrode 41A to the N-type gate electrode 51 and thereby electrical conduction is established between the anode electrode 41A and the cathode electrode 61K. In this case, a hole and an electron recombine with each other in the N-type active layer 2012. At that time, although similar recombination occurs also in the P-type gate layer 2021 and the N-type gate layer 2031, the recombination occurs in the active layer 2012 with high probability since the dopant concentration Npg in the P-type gate layer 2021 is set low and the thickness Tng (=T3) of the N-type gate layer 2031 is set thin. Light generated by the recombination is emitted through the anode layer 2041.

(2-3) Effect

In the light-emitting thyristor 20 according to the second embodiment, the composite function β of the current amplification factors becomes large while sufficient withstand voltage performance is secured by the calculations described above, and thereby the breakover voltage Vb can be reduced. Further, since the P-type gate layer 2021 and the N-type gate layer 2031 serve also as absorptive layers that absorb the light generated in the active layer 2012, the light extraction efficiency can be increased by reducing the thicknesses of these layers. With the above-described features, in the light-emitting thyristor 20 according to the second embodiment, the breakover voltage Vb decreases and the luminous efficiency increases.

Further, since the etching stop layer 2032 is used in the fabrication process, the thickness of the N-type gate layer 2031 can be set thin and the breakover voltage Vb can be lowered.

Incidentally, the above description has been given of the example in which semiconductor layers are stacked upward from the substrate part 101 in the order of NPNP, the etching stop layer 2032 is provided immediately above the N-type gate layer 2031, the Al composition ratios of the active layer 2012, the P-type gate layer 2021 and the N-type gate layer 2031 are equal to each other, and the gate electrode 51 is connected to the N-type gate layer 2031. However, it is also possible to employ a different structure such as a structure including no etching stop layer 2032.

(3) Third Embodiment (3-1) Configuration

Figure 17:
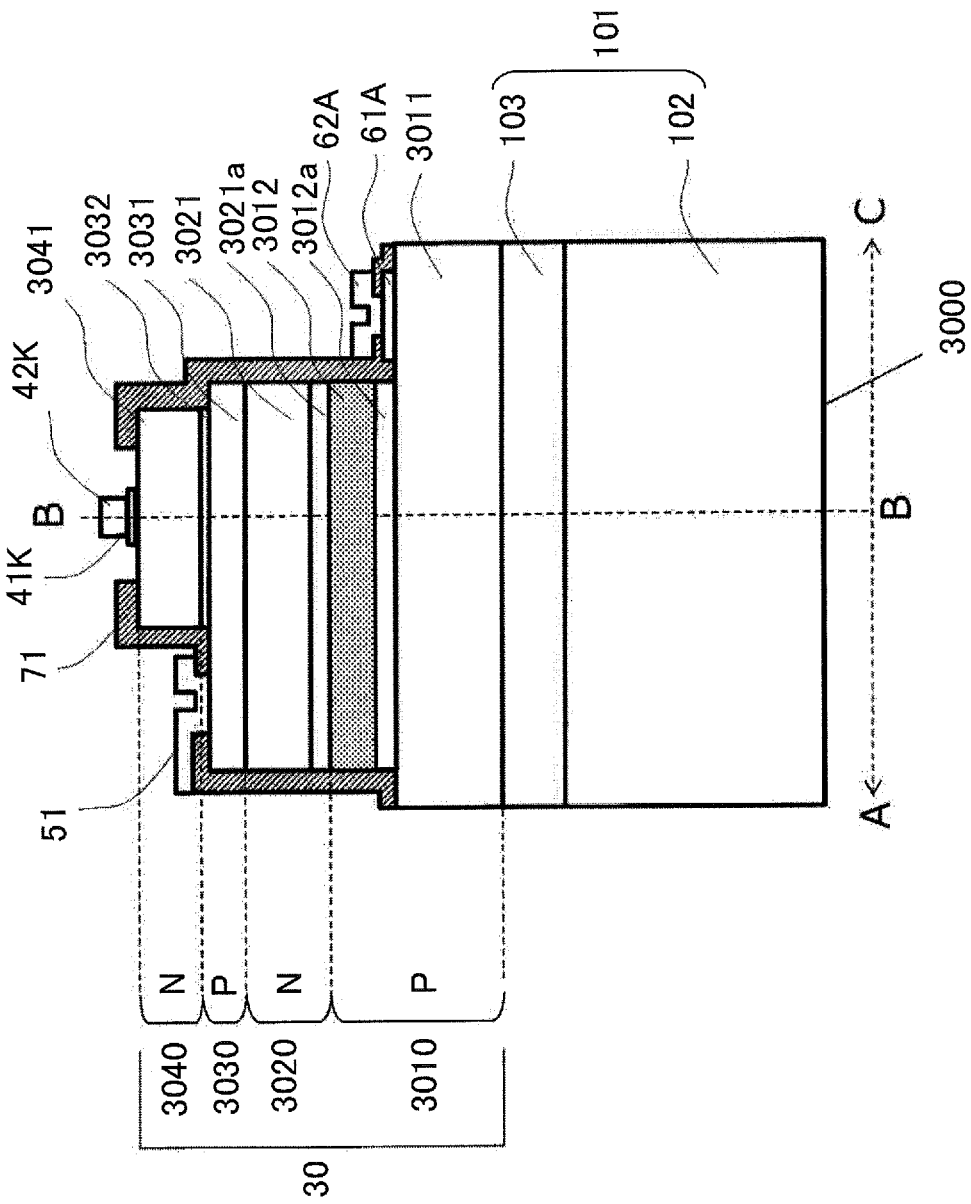
FIG. 17 is a schematic cross-sectional view showing the structure of a light-emitting thyristor according to a third embodiment of the present invention.
Figure 18:
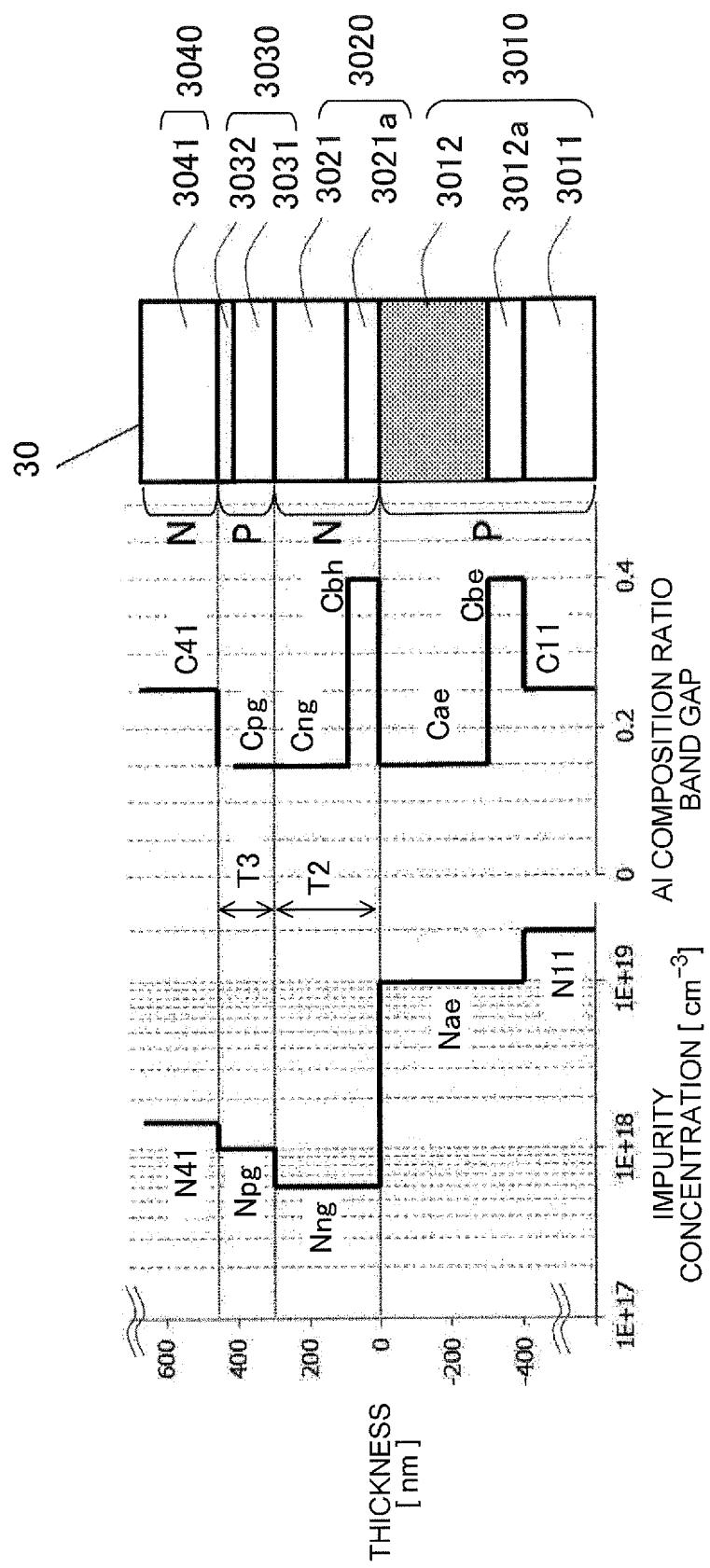
FIG. 18 is a diagram showing an example of the dopant concentration, the thickness and the Al composition ratio of each semiconductor layer of the light-emitting thyristor according to the third embodiment.

FIG. 17 is a schematic cross-sectional view showing the structure of a light-emitting thyristor 30 according to a third embodiment. FIG. 18 is a diagram showing an example of the dopant concentration, the thickness and the Al composition ratio of each semiconductor layer of the light-emitting thyristor 30. The light-emitting thyristor 30 according to the third embodiment differs from the light-emitting thyristor 10 according to the first embodiment in including a hole barrier layer 3021a and an electron barrier layer 3012a having higher Al composition ratios than the anode layer and the cathode layer. First to fourth semiconductor layers 3010, 3020, 3030 and 3040 of the light-emitting thyristor 30 correspond to the first to fourth semiconductor layers 1010, 1020, 1030 and 1040 of the light-emitting thyristor 10. The structure of an anode layer 3011, an active layer 3012, an N-type gate layer 3021, an etching stop layer 3032 and a cathode layer 3041 of the light-emitting thyristor 30 is respectively the same as the structure of the anode layer 1011, the active layer 1012, the N-type gate layer 1021, the etching stop layer 1032 and the cathode layer 1041 of the light-emitting thyristor 10.

In a case where AlGaAs-based semiconductor materials are used for the first to fourth semiconductor layers 3010, 3020, 3030 and 3040, the anode layer 3011 is, for example, a P-type $Al_{0.25}Ga_{0.75}As$ layer, the electron barrier layer 3012a is, for example, a P-type $Al_{0.40}Ga_{0.60}As$ layer, the active layer 3012 is, for example, a P-type $Al_{0.15}Ga_{0.85}As$ layer, the hole barrier layer 3021a is, for example, an N-type $Al_{0.40}Ga_{0.60}As$ layer, the N-type gate layer 3021 is, for example, an N-type $Al_{0.15}Ga_{0.85}As$ layer, the P-type gate layer 3031 is, for example, a P-type $Al_{0.15}Ga_{0.85}As$ layer, and the cathode layer 3041 is, for example, an N-type $Al_{0.25}Ga_{0.75}As$ layer. The etching stop layer 3032 is, for example, a P-type $In_{0.49}Ga_{0.51}P$ layer.

In the third embodiment, the base layer of the PNP transistor in the light-emitting thyristor 30 is separated into two layers: the hole barrier layer 3021a and the N-type gate layer 3021, and thus the sum total of the thicknesses of the two layers is set at the thickness Tng in the first embodiment. Further, the dopant concentration of the electron barrier layer 3012a is equal to the dopant concentration Nae of the active layer 3012, and the dopant concentration of the hole barrier layer 3021a is equal to the dopant concentration Nng of the N-type gate layer 3021.

The light-emitting thyristor 30 according to the third embodiment is not limited to the structure shown in FIG. 18. In the light-emitting thyristor 20 according to the second embodiment, if the following conditions (14) to (19) are satisfied, the composite function β of the current amplification factors can be made larger compared to that in conventional technology while securing withstand voltage of 8 V or higher is secured.

$$150 \text{ nm} \leq Tpg \ (=T3) \leq 180 \text{ nm} \quad (14)$$

$$270 \text{ nm} \leq Tng \ (=T2) \leq 330 \text{ nm} \quad (15)$$

$$1.2 \times 10^{18} \text{ cm}^{-3} \leq Nk < 1.8 \times 10^{18} \text{ cm}^{-3} \quad (16)$$

$$8 \times 10^{17} \text{ cm}^{-3} \leq Npg \leq 1.2 \times 10^{18} \text{ cm}^{-3} \quad (17)$$

$$4 \times 10^{17} \text{ cm}^{-3} \leq Nng \leq 6 \times 10^{17} \text{ cm}^{-3} \quad (18)$$

$$1.2 \times 10^{18} \text{ cm}^{-3} \leq Nae \leq 1.5 \times 10^{19} \text{ cm}^{-3} \quad (19)$$

Within the above ranges, the composite function β of the current amplification factors can be made larger compared to that in conventional technology while withstand voltage of 8 V or higher is secured.

The light-emitting thyristor 30 according to the third embodiment satisfies the following conditions (20) and (21):

$$Tpg < Tng \quad (20)$$

$$Nng < Npg \leq Nae \quad (21)$$

The reason for providing the hole barrier layer 3021a having a high Al composition ratio Cbh and a wide band gap between the P-type active layer 3012 and the N-type gate layer 3021 is that an energy barrier occurs against holes in the active layer 3012 moving towards the cathode layer 3041 in a case where the band gap of the hole barrier layer 3021a is wider than the band gap of the cathode layer 3041. Namely, since the hole barrier layer 3021a with the wide band gap has a function as a barrier layer limiting the passage of holes, it is possible to inhibit holes from leaking out from the active layer 3012. Accordingly, the decrease in the amount of holes in the active layer 3012 is inhibited and the occurrence probability of the recombination of a hole and an electron in the active layer 3012 becomes high.

The reason for providing the electron barrier layer 3012a having a high Al composition ratio Cbe and a wide band gap between the P-type active layer 3012 and the anode layer 3011 is that the band gap of the electron barrier layer 3012a works as a barrier layer against electrons in the P-type active layer 3012 advancing towards the electron barrier layer 3012a, electron confinement effect in the active layer 3012 can be enhanced, and the recombination in the active layer 3012 can be increased.

(3-2) Operation

The light-emitting thyristor 30 according to the third embodiment operates similarly to the light-emitting thyristor 10 according to the first embodiment.

(3-3) Effect

In the light-emitting thyristor 30 according to the third embodiment, similarly to the light-emitting thyristor 10 according to the first embodiment, the composite function β of the current amplification factors becomes large while sufficient withstand voltage performance is secured, and thereby the breakover voltage Vb can be reduced.

Further, the light extraction efficiency increases since the P-type gate layer 3031 absorbing the light from the active layer 3012 is designed to be thin.

Furthermore, energy barriers are formed by the electron barrier layer 3012a and the hole barrier layer 3021a which are adjacent to the active layer 3012, carriers are confined in the active layer 3012, and thereby the recombination in the active layer 3012 is promoted and internal quantum efficiency increases. Accordingly, the light amount increases further compared to the first embodiment.

Incidentally, the above description has been given of the example in which semiconductor layers are stacked upward from the substrate part 101 in the order of PNPN. However, it is also possible to employ a different structure such as a structure including no etching stop layer 3032. Further, it is also possible to incorporate one or more of the various types of structures described in the first and second embodiments.

(4) Fourth Embodiment

Figure 19:
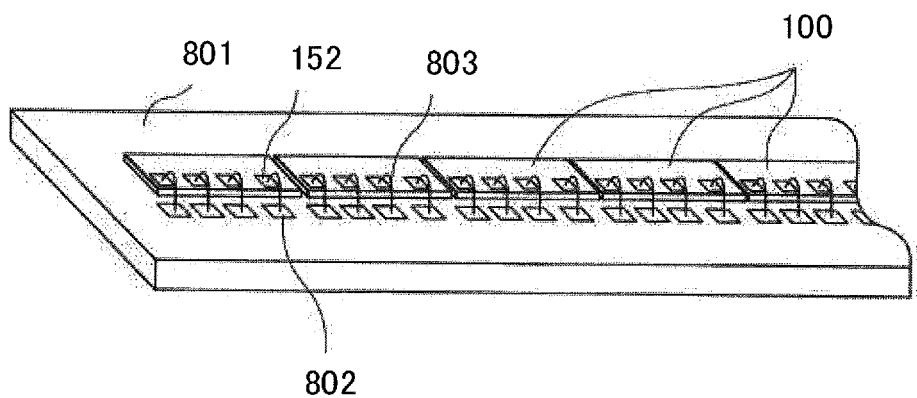
FIG. 19 is a schematic perspective view showing the structure of a substrate unit as a principal part of an optical print head according to a fourth embodiment of the present invention.

FIG. 19 is a schematic perspective view showing the structure of a principal part of an optical print head according to a fourth embodiment. As shown in FIG. 19, a substrate unit as the principal part includes a printed wiring board 801 as a mounting substrate and a plurality of light-emitting element chips 100 arranged like an array. The light-emitting element chips 100 are fixed on the printed wiring board 801 by using thermosetting resin or the like. Electrode pads 152 of the light-emitting element chips 100 for external connection and connection pads 802 of the printed wiring board 801 are electrically connected to each other by bonding wires 803. The printed wiring board 801 may also be equipped with various types of wiring patterns, electronic components, connectors, etc. It is also possible to employ one of other light-emitting element chips described in the first to third embodiments instead of the light-emitting element chip 100.

Figure 20:
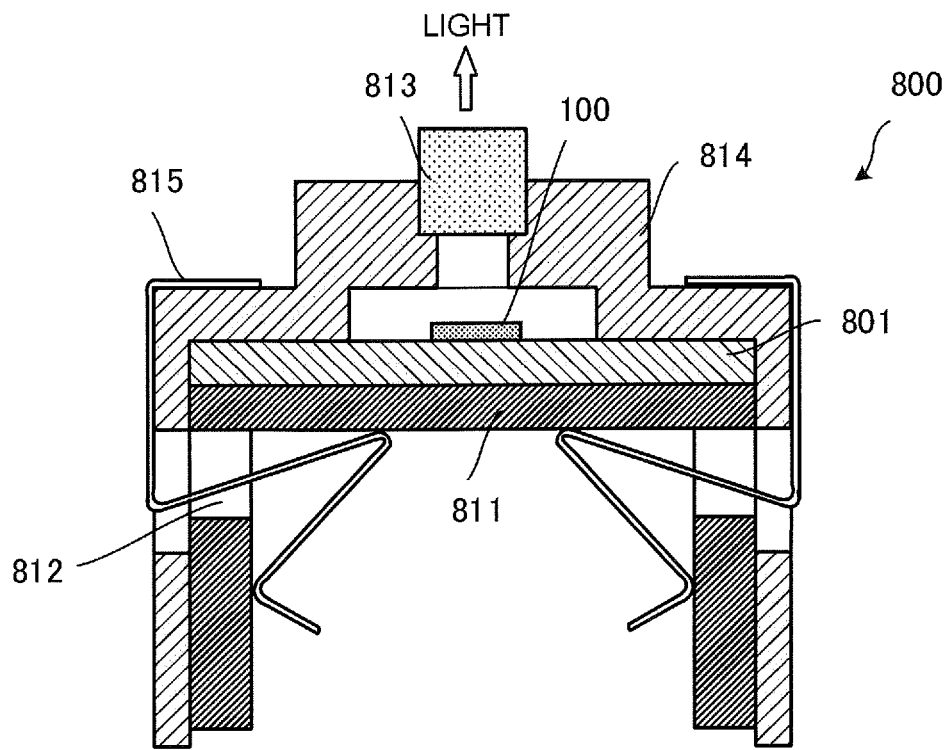
FIG. 20 is a schematic cross-sectional view showing the structure of the optical print head according to the fourth embodiment.

FIG. 20 is a schematic cross-sectional view showing the structure of the optical print head 800 according to the fourth embodiment. The optical print head 800 is an exposure device of an electrophotographic printer as an image forming device of the electrophotographic type. As shown in FIG. 20, the optical print head 800 includes a base member 811, the printed wiring board 801, the light-emitting element chips 100, a lens array 813 including a plurality of upright isometric imaging lenses, a lens holder 814, and clampers 815 as spring members. The base member 811 is a member for fixing the printed wiring board 801. Side faces of the base member 811 are provided with opening parts 812 to be used for fixing the printed wiring board 801 and the lens holder 814 to the base member 811 by use of the clampers 815. The lens holder 814 is formed by injection molding of organic polymeric material or the like, for example. The lens array 813 is a set of optical lenses focusing light emitted from the light-emitting element chips 100 on a photosensitive drum as an image carrier. The lens holder 814 holds the lens array 813 at a prescribed position with respect to the base member 811. The clampers 815 clamp and hold components via the opening parts 812 of the base member 811 and opening parts of the lens holder 814.

In the optical print head 800, the light-emitting thyristors of the light-emitting element chips 100 selectively emit light according to print data, and the light emitted from the light-emitting thyristors is focused on the uniformly charged photosensitive drum by the lens array 813. By this process, an electrostatic latent image is formed on the photosensitive drum, and thereafter, an image made of a developing agent is formed (printed) on a print medium (sheet) by a development process, a transfer process and a fixation process.

As described above, since the optical print head 800 according to the fourth embodiment includes the light-emitting element chips 100 of low variations in light emission intensity, print quality can be improved by installing the optical print head 800 in an image forming device.

(5) Fifth Embodiment

Figure 21:
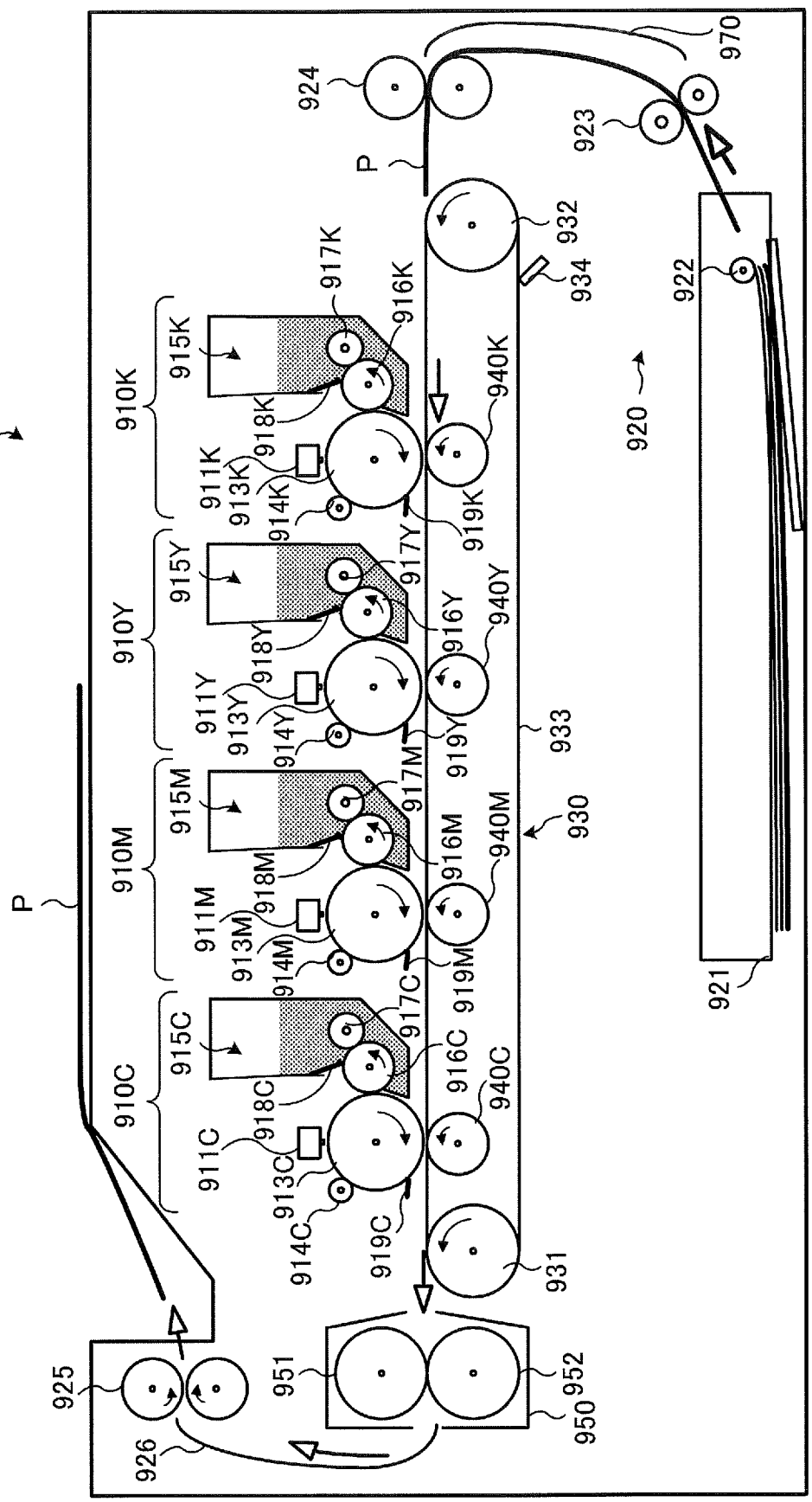
FIG. 21 is a schematic cross-sectional view showing the structure of an image forming device according to a fifth embodiment of the present invention.

FIG. 21 is a schematic cross-sectional view showing the structure of an image forming device 900 according to a fifth embodiment. The image forming device 900 is a color printer using an electrophotographic process, for example.

As shown in FIG. 21, principal components of the image forming device 900 include image formation sections (i.e., process units) 910K, 910Y, 910M and 910C for forming a toner image (i.e., a developing agent image) on a record medium P such as a sheet of paper by an electrophotographic process, a medium supply section 920 for supplying the record medium P to the image formation sections 910K, 910Y, 910M and 910C, and a conveyance section 930 for conveying the record medium P. Further, the image forming device 900 includes transfer rollers 940K, 940Y, 940M and 940C as transfer sections arranged respectively corresponding to the image formation sections 910K, 910Y, 910M and 910C, a fixation device 950 for fixing the toner images transferred onto the record medium P, and a guide 926 and an ejection roller pair 925 as a medium ejection section for ejecting the record medium P after passing through the fixation device 950 to the outside of a housing of the image forming device 900. The number of image formation sections included in the image forming device 900 may also be three or less or five or more. Further, the image forming device 900 can also be a monochrome printer, in which the number of image formation sections is one, as long as the image forming device 900 is a device forming an image on a record medium P by means of the electrophotographic process.

As shown in FIG. 21, the medium supply section 920 includes a medium cassette 921, a hopping roller 922 for drawing out the record media P loaded in the medium cassette 921 sheet by sheet, a roller pair 923 for conveying the record medium P drawn out of the medium cassette 921, a guide 970 for guiding the record medium P, and a registration roller and a pinch roller 924 for correcting skew of the record medium P.

The image formation sections 910K, 910Y, 910M and 910C respectively form a black (K) toner image, a yellow (Y) toner image, a magenta (M) toner image and a cyan (C) toner image on the record medium P. The image formation sections 910K, 910Y, 910M and 910C are arranged side by side along a medium conveyance path from an upstream side to a downstream side (i.e., from right to left in FIG. 21) in a medium conveyance direction. Each of the image formation sections 910K, 910Y, 910M and 910C may also be configured as an attachable and detachable unit. The image formation sections 910K, 910Y, 910M and 910C have basically the same structure as each other except for the difference in the color of the stored toner.

The image formation sections 910K, 910Y, 910M and 910C respectively include optical print heads 911K, 911Y, 911M and 911C as exposure devices for their respective colors. Each of the optical print heads 911K, 911Y, 911M and 911C is the optical print head 800 according to the fourth embodiment.

Image formation sections 910K, 910Y, 910M, 910C include photosensitive drums 913K, 913Y, 913M, 913C as rotatably supported image carriers and charging rollers 914K, 914Y, 914M, 914C as charging members for uniformly charging the surfaces of the photosensitive drums 913K, 913Y, 913M, 913C. Further, image formation sections 910K, 910Y, 910M, 910C includes development units 915K, 915Y, 915M, 915C for forming a toner image corresponding to an electrostatic latent image by supplying the toner to the surfaces of the photosensitive drums 913K, 913Y, 913M, 913C after the electrostatic latent image is formed on the surfaces of the photosensitive drums 913K, 913Y, 913M, 913C by the exposure by the optical print heads 911K, 911Y, 911M, 911C.

Development units 915K, 915Y, 915M, 915C include toner storage sections as developing agent storage sections forming developing agent storage spaces for storing the toner and development rollers 916K, 916Y, 916M, 916C as developing agent carriers for supplying the toner to the surfaces of the photosensitive drums 913K, 913Y, 913M, 913C. Further, development units 915K, 915Y, 915M, 915C include supply rollers 917K, 917Y, 917M, 917C for supplying the toner stored in the toner storage sections to the development rollers 916K, 916Y, 916M, 916C and development blades 918K, 918Y, 918M, 918C as toner regulation members for regulating the thickness of a toner layer on the surfaces of the development rollers 916K, 916Y, 916M, 916C.

The exposure by the optical print heads 911K, 911Y, 911M, 911C is performed on the uniformly charged surfaces of the photosensitive drums 913K, 913Y, 913M, 913C based on image data for the printing. The optical print heads 911K, 911Y, 911M, 911C include light-emitting element arrays in which a plurality of light-emitting thyristors as light-emitting elements are arranged in an axis line direction of the photosensitive drums 913K, 913Y, 913M, 913C.

As shown in FIG. 21, the conveyance section 930 includes a conveyance belt (i.e., transfer belt) 933 electrostatically attracting and conveying the record medium P, a drive roller 931 rotated by a drive section and driving the conveyance belt 933, and a tension roller (i.e., driven roller) 932 forming a pair with the drive roller 931 and applying tension to the conveyance belt 933.

As shown in FIG. 21, the transfer rollers 940K, 940Y, 940M and 940C are arranged to respectively face the photosensitive drums 913K, 913Y, 913M and 913C of the image formation sections 910K, 910Y, 910M and 910C across the conveyance belt 933. The toner images respectively formed on the surfaces of the photosensitive drums 913K, 913Y, 913M and 913C of the image formation sections 910K, 910Y, 910M and 910C are successively transferred by the transfer rollers 940K, 940Y, 940M and 940C to the top surface of the record medium P conveyed along the medium conveyance path in the direction of the arrow. Image formation sections 910K, 910Y, 910M, 910C include cleaning devices 919K, 919Y, 919M, 919C for removing the toner remaining on the photosensitive drums 913K, 913Y, 913M, 913C after the toner image developed on the photosensitive drums 913K, 913Y, 913M, 913C is transferred to the record medium P.

The fixation device 950 includes a pair of rollers 951 and 952 pressed against each other. The roller 951 is a roller (namely, heat roller) 951 including a built-in heater, while the roller 952 is a pressure roller pressed against the roller 951. The record medium P with the toner images to be fixed passes between the pair of rollers 951 and 952 of the fixation device 950. At the time of passage, the toner images to be fixed are heated and pressed and thereby fixed on the record medium P.

A lower surface part of the conveyance belt 933 is provided with a cleaning mechanism including a cleaning blade 934, a waste toner storage section (not shown) and so on.

At the time of printing, a record medium P in the medium cassette 921 is drawn out by the hopping roller 922 and is sent to the roller pair 923. Subsequently, the record medium P is sent from the roller pair 923 to the conveyance belt 933 via the registration roller•pinch roller 924 and is conveyed to the image formation sections 910K, 910Y, 910M and 910C according to the traveling of the conveyance belt 933. In image formation sections 910K, 910Y, 910M, 910C, the surfaces of the photosensitive drums 913K, 913Y, 913M, 913C are charged by the charging rollers 914K, 914Y, 914M, 914C and are exposed by the optical print heads 911K, 911Y, 911M, 911C, and thereby an electrostatic latent image is formed. The toner formed into a thin layer on the development roller 916K, 916Y, 916M, 916C electrostatically adheres to the electrostatic latent image, and thereby a toner image of each color is formed. The toner images of the respective colors are transferred onto the record medium P by the transfer rollers 940K, 940Y, 940M and 940C, and thereby a color toner image is formed on the record medium P. After the image transfer, the toner remaining on the photosensitive drums 913K, 913Y, 913M, 913C is removed by the cleaning devices 919K, 919Y, 919M, 919C. The record medium P with the color toner image formed thereon is sent to the fixation device 950. In the fixation device 950, the color toner image is fixed on the record medium P, and thereby a color image is formed. The record medium P with the color image formed thereon is conveyed along the guide 926 and ejected by the ejection roller pair 925 to a stacker.

As described above, since the image forming device 900 according to the fifth embodiment employs the optical print head 800 according to the fourth embodiment as each of the optical print heads 911K, 911Y, 911M and 911C, the print quality of the image forming device 900 can be improved.

(6) Modification

It is also possible to employ structures obtained by reversing the conductivity types of the semiconductor layers forming the light-emitting thyristors in the first to third embodiments.

What is claimed is:

1. A light-emitting thyristor comprising:
   a first semiconductor layer of a first conductivity type;
   a second semiconductor layer of a second conductivity type, the second semiconductor layer being arranged adjacent to the first semiconductor layer;
   a third semiconductor layer of the first conductivity type, the third semiconductor layer being arranged adjacent to the second semiconductor layer; and
   a fourth semiconductor layer of the second conductivity type, the fourth semiconductor layer being arranged adjacent to the third semiconductor layer, wherein
   a part of the first semiconductor layer is an active layer adjacent to the second semiconductor layer,
   a dopant concentration of the active layer is higher than or equal to a dopant concentration of the third semiconductor layer,
   a thickness of the third semiconductor layer is thinner than a thickness of the second semiconductor layer, and
   a dopant concentration of the second semiconductor layer is lower than the dopant concentration of the third semiconductor layer.

2. The light-emitting thyristor according to claim 1, wherein a band gap of the active layer is narrower than or equal to a band gap of the second semiconductor layer and narrower than or equal to a band gap of the third semiconductor layer.

3. The light-emitting thyristor according to claim 1, wherein the third semiconductor layer includes a gate layer of the first conductivity type and an etching stop layer.

4. The light-emitting thyristor according to claim 1, wherein the first conductivity type is a P type and the second conductivity type is an N type.

5. The light-emitting thyristor according to claim 4, wherein
   the thickness of the third semiconductor layer is in a range from 150 nm to 180 nm, and
   the thickness of the second semiconductor layer is in a range from 270 nm to 330 nm.

6. The light-emitting thyristor according to claim 4, wherein
   a dopant concentration of the fourth semiconductor layer is in a range from $1.2 \times 10^{18}$ cm$^{-3}$ to $1.8 \times 10^{18}$ cm$^{-3}$,
   the dopant concentration of the third semiconductor layer is in a range from $8 \times 10^{17}$ cm$^{-3}$ to $1.2 \times 10^{18}$ cm$^{-3}$,
   the dopant concentration of the second semiconductor layer is in a range from $4 \times 10^{17}$ cm$^{-3}$ to $6 \times 10^{17}$ cm$^{-3}$, and
   the dopant concentration of the active layer is in a range from $1.2 \times 10^{18}$ cm$^{-3}$ to $1.5 \times 10^{19}$ cm$^{-3}$.

7. The light-emitting thyristor according to claim 1, wherein the first conductivity type is an N type and the second conductivity type is a P type.

8. The light-emitting thyristor according to claim 7, wherein
   the thickness of the third semiconductor layer is in a range from 180 nm to 220 nm, and
   the thickness of the second semiconductor layer is in a range from 270 nm to 330 nm.

9. The light-emitting thyristor according to claim 7, wherein
   a dopant concentration of the fourth semiconductor layer is in a range from $4 \times 10^{18}$ cm$^{-3}$ to $6 \times 10^{18}$ cm$^{-3}$,
   the dopant concentration of the third semiconductor layer is in a range from $7 \times 10^{17}$ cm$^{-3}$ to $1 \times 10^{18}$ cm$^{-3}$,
   the dopant concentration of the second semiconductor layer is in a range from $4 \times 10^{17}$ cm$^{-3}$ to $6 \times 10^{17}$ cm$^{-3}$, and
   the dopant concentration of the active layer is in a range from $1 \times 10^{18}$ cm$^{-3}$ to $1.5 \times 10^{19}$ cm$^{-3}$.

10. The light-emitting thyristor according to claim 1, wherein
    the first semiconductor layer includes a first layer, the active layer, and a second layer arranged between the first layer and the active layer,
    a band gap of the first layer is wider than a band gap of the active layer, and
    a band gap of the second layer is wider than the band gap of the first layer and a band gap of the fourth semiconductor layer.

11. The light-emitting thyristor according to claim 10, wherein
    the second semiconductor layer includes a third layer adjacent to the active layer and a fourth layer arranged between the third layer and the third semiconductor layer, and
    a band gap of the third layer is wider than the band gap of the first layer and the band gap of the fourth semiconductor layer.

12. The light-emitting thyristor according to claim 1, further comprising:
    a first electrode electrically connected with the first semiconductor layer;
    a second electrode electrically connected with the second semiconductor layer or the third semiconductor layer; and
    a third electrode electrically connected with the fourth semiconductor layer.

13. A light-emitting element chip comprising:
    a substrate part; and
    the light-emitting thyristor according to claim 1 arranged on the substrate part.

14. The light-emitting element chip according to claim 13, wherein the first semiconductor layer is arranged on a side closer to the substrate part than the fourth semiconductor layer.

15. The light-emitting element chip according to claim 13, wherein the first semiconductor layer is arranged on a side farther from the substrate part than the fourth semiconductor layer.

16. An optical print head comprising the light-emitting element chip according to claim 13.

17. An image forming device comprising the optical print head according to claim 16.

* * * * *